United States Patent [19]
Honda

[11] Patent Number: 5,977,597
[45] Date of Patent: Nov. 2, 1999

[54] LAYOUT STRUCTURE OF SEMICONDUCTOR MEMORY WITH CELLS POSITIONED IN TRANSLATED RELATION IN FIRST AND SECOND DIRECTIONS

[75] Inventor: Hiroki Honda, Tokyo, Japan

[73] Assignee: Mitsubishi Denki Kabushiki Kaisha, Tokyo, Japan

[21] Appl. No.: 08/900,125

[22] Filed: Jul. 25, 1997

[30] Foreign Application Priority Data

Mar. 10, 1997 [JP] Japan .................................. 9-055015

[51] Int. Cl.⁶ .................................................. H01L 29/76
[52] U.S. Cl. .................... 257/369; 257/370; 257/390; 257/903
[58] Field of Search .................................. 257/369, 370, 257/903, 390

[56] References Cited

U.S. PATENT DOCUMENTS

| | | |
|---|---|---|
| 4,951,112 | 8/1990 | Choi et al. . |
| 5,521,860 | 5/1996 | Ohkubo . |
| 5,736,771 | 4/1998 | Huang et al. ............................ 257/390 |
| 5,744,844 | 4/1998 | Higuchi .................................. 257/369 |

FOREIGN PATENT DOCUMENTS

| | | |
|---|---|---|
| 62-293668 | 12/1987 | Japan . |
| 63-305551 | 12/1988 | Japan . |

OTHER PUBLICATIONS

J. R. Pfiester, et al., "A Symmetric Vss Cross–Under Bitcell Technology For 64Mb SRAMs", IEEE IEDM, 1994, pp. 623–626.

T. Yamanaka, et al., "Advanced TFT SRAM Cell Technology Using A Phase–Shift Lithography", IEEE Transactions on Electron Devices, vol. 42, No. 7, Jul. 1995, pp. 1305–1312.

*Primary Examiner*—Valencia Martin-Wallace
*Attorney, Agent, or Firm*—Oblon, Spivak, McClelland, Maier & Neustadt, P.C.

[57] ABSTRACT

A layout structure of an SRAM for reductions in the number of interconnect layers and in the number of connection holes with conventional advantages maintained is disclosed. Contact holes and fields which have been shared between cells vertically adjacent to each other in plan view are divided between the cells. The cells are then positioned in translated relation also in a bit line direction (D1). In a resultant region, first-level polysilicon interconnect layers (1G(G)) for a GND line and first-level polysilicon interconnect layers (1G(W)) for a word line are formed in parallel in a word line direction (D2). Connection holes (GK2, GK1) for connecting gate electrodes of driver transistors (DTr1, DTr2) and fields (FL) are also used for connection holes (GK3) for connecting the fields (FL) and the GND interconnect layers (1G(G)). Further, interconnect layers having a high power supply potential is formed on the interconnect layers (1G(G)).

19 Claims, 15 Drawing Sheets

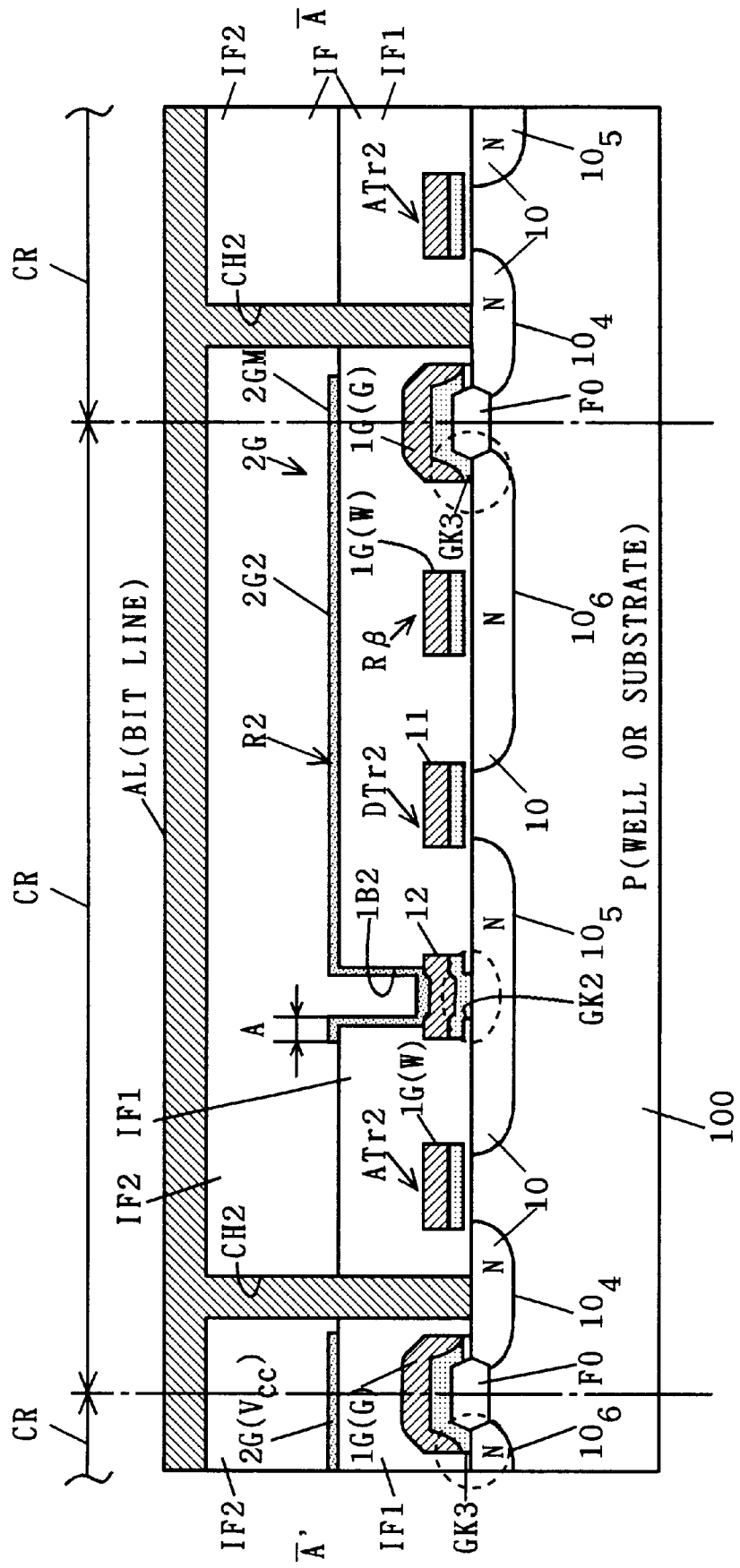

<LAYOUT>

<RESIST>

LAYOUT STRUCTURE OF SEMICONDUCTOR MEMORY WITH CELLS POSITIONED IN TRANSLATED RELATION IN FIRST AND SECOND DIRECTIONS

BACKGROUND OF THE INVENTION

1. Field of the Invention

The present invention relates to a technique for layout of a plurality of cells in a semiconductor memory such as an SRAM (static random access memory).

2. Description of the Background Art

FIGS. 14 and 15 are plan views of a layout structure of a high resistance load SRAM cell. This layout is disclosed in J. R. Pfiester etc., "A symmetric Vss cross-under bitcell technology for 64 Mb SRAMs", IEEE IEDM94, pp.623–626 (1994). As illustrated in FIG. 14, the layout structure comprises fields FLP, gate buried contacts GKP, first-level polysilicon interconnect layers 1GP for a gate, first buried contacts 1BP, and second-level polysilicon interconnect layers 2GP for a GND line. This provides word lines for access transistors ATrP1, ATrP2, gate layers for driver transistors DTrP1, DTrP2, and GND lines. Regions R α in which the fields FLP and the first-level polysilicon interconnect layers 1GP intersect have a low resistance because of implantation of impurities prior to the formation of the gates.

With reference to FIG. 15, the layout structure further comprises second buried contacts 2B, third-level polysilicon interconnect layers 3GP for a $V_{CC}$ line, contact holes CHP for contact with a bit line and a $\overline{bit}$ line, and aluminum layers ALP and $\overline{ALP}$ for the bit line and the $\overline{bit}$ line. This provides high-resistance and $V_{CC}$ lines (which one is produced to depend upon the presence/absence of impurity implantation), and the bit/$\overline{bit}$ line. The reference character CRP in FIGS. 14 and 15 designates the range of one cell.

The above described layout structure may implement a high resistance load SRAM circuit (FIG. 1) on a semiconductor substrate.

This layout has advantages to be described below because of its good symmetric property.

(1) Vertical or horizontal deviation of patterns significantly influences transistor characteristics. The above described layout, however, include symmetric patterns, permitting accordingly stable cell operation.

(2) The basically linear configuration of the patterns increases process stability since a pattern of a quadrilateral cross-sectional configuration is easy to produce but a pattern of a non-quadrilateral cross-sectional configuration is difficult to produce correctly. The above described layout includes fewer non-quadrilateral patterns.

(3) The longitudinal direction of the word lines 1GP (the gates of the access transistors) is the same as the longitudinal direction of the gates of the driver transistors. That is, both of the word lines 1GP and the gate layers for the driver transistors extend linearly in parallel in the direction of the word lines. This is advantageous in good controllability of the gate length during fabrication and in stable transistor characteristics. When a gate pattern is formed by the photolithographic process, a mask pattern has a rectangular shape, but a resist pattern influenced by light reflected from an underlying field pattern is inevitably rounded and has an unstable shape in actuality. However, the above described layout wherein the gate layers and the word lines 1GP extend linearly in the same direction in parallel to the underlying field pattern may reduce the influence of the rounded resist pattern.

The conventional layout structure illustrated in FIGS. 14 and 15, however, presents drawbacks to be described below.

First, it is necessary for the above-mentioned technique to form on the semiconductor substrate a total of four levels of interconnect layers: three levels of polysilicon interconnect layers and one level of metal interconnect layer, that is, the first-level, second-level, and third-level polysilicon interconnect layers (1GP, 2GP, 3GP), and the aluminum interconnect layers ALP, $\overline{ALP}$. This inevitably requires a prolonged process and increased device costs.

The second drawback is that the third-level interconnect layers 3GP for the $V_{CC}$ line have a non-linear portion as shown in FIG. 15 in the above described layout including a number of linear patterns. The non-linear portion is an angular portion 3GR of the polysilicon interconnect layers 3GP which is enclosed by dotted circle of FIG. 15. Such a configuration creates a mismatch between a resist pattern RP2 and a layout pattern RP1, as schematically illustrated in the plan views of FIGS. 16A and 16B, for example. In the portion 3GR, the resist is not completely removed but remains during the photolithographic process as shown in FIG. 16B, resulting in the rounded configuration of the resist pattern RP2. This significantly decreases the controllability of the high resistance portions 3GP of FIG. 15. Specifically, for layout design, the value of a high resistance to be formed in a linearly extending high resistance portion formation portion 3GHR of the third-level polysilicon interconnect layers 3GP is previously predicted depending upon the number of sheets included in the area of the high resistance portion formation portion 3GHR. Unfortunately, if the rounded corners of the high resistance portion formation portion 3GHR shown in FIG. 16B cause the substantially decreased linear parts of the portion 3GHR, the resistance value of the high resistance portions 3GP is less than the predicted value, and the actual resistance value is not predictable during fabrication. The conventional layout structure still has such a problem to be solved.

The third drawback, as schematically shown in FIG. 17, is that the necessity to set a cover margin A for the second buried contact 2B, a clearance C between the third-level polysilicon interconnect layers 3GP, and a margin D for separation between the third-level polysilicon interconnect layer 3GP and the contact hole CHP decreases the width W of the polysilicon interconnect layer 3GP serving as a $V_{CC}$ interconnect line. This increases the resistance of the $V_{CC}$ interconnect line to develop a potential difference, failing to correctly supply a power supply potential $V_{CC}$.

The fourth drawback is the increase in the resistance of a GND interconnect layer which should originally have a very low resistance. The gate lines and word lines are made of a composite material, for example, WSi/poly Si for the decrease in resistance thereof. It is a common practice to apply such composition to the GND interconnect layers for the above described purpose. The same is true for the conventional layout. In the conventional layout wherein the second-level interconnect layers 2GP for the GND line are formed above the first-level interconnect layers 1GP, this application produces a greater step of connection holes to increase the depth of the first buried contacts 1BP, resulting in an unignorable level of plug resistance, as will be described in greater detail later.

SUMMARY OF THE INVENTION

According to a first aspect of the present invention, a semiconductor memory comprises: an underlying layer of a first conductivity type; and a plurality of cells formed on a surface of the underlying layer and in the underlying layer and arranged in a first direction and in a second direction perpendicular to the first direction, wherein each of the plurality of cells is positioned in translated relation in the first and second directions to provide the same layout.

Preferably, according to a second aspect of the present invention, in the semiconductor memory of the first aspect, the layout of each of the plurality of cells is symmetrical with respect to a center point of each cell.

Preferably, according to a third aspect of the present invention, in the semiconductor memory of the first aspect, each of the plurality of cells comprises independent first and second device formation regions; respective internal structures of the first device formation region of one of the plurality of cells and its adjacent cell are positioned in translated relation in the first direction; respective internal structures of the second device formation region of the one cell and the adjacent cell are positioned in translated relation in the first direction; and the internal structures of the first device formation region and the second device formation region are arranged in reverse order in the first direction.

Preferably, according to a fourth aspect of the present invention, the semiconductor memory of the first aspect further comprises: ground interconnect layers formed on the surface of the underlying layer between one of the plurality of cells and its adjacent cell for supplying a common ground potential to the one cell and the adjacent cell, the ground interconnect layers extending in the second direction and serving as a first-level interconnect layer.

Preferably, according to a fifth aspect of the present invention, the semiconductor memory of the first aspect further comprises: an insulating layer formed on the surface of the underlying layer and serving as an interlayer insulating film for each of the plurality of cells; and first and second bit line interconnect layers formed on the interlayer insulating film in opposed relation to each other and extending in the first direction, the first and second bit line interconnect layers being common to the plurality of cells arranged in an array in the first direction, wherein each of the plurality of cells comprises: a first device formation region positioned immediately under the first bit line interconnect layer on the surface of the underlying layer and in the underlying layer and formed only within a cell range of each cell, the first device formation region extending in the first direction; and a second device formation region positioned immediately under the second bit line interconnect layer on the surface of the underlying layer and in the underlying layer and formed only within a cell range of each cell, the second device formation region extending in the first direction in opposed relation to the first device formation region.

Preferably, according to a sixth aspect of the present invention, in the semiconductor memory of the fifth aspect, cells adjacent to any one of the plurality of cells in the first direction are defined as first and second adjacent cells; and each of the plurality of cells comprises: first, second, and third diffusion layer formation regions including a diffusion layer of a second conductivity type, the first, second, and third diffusion layer formation regions being formed in insular configuration in the surface of the underlying layer and in the underlying layer within the first device formation region, the first, second, and third diffusion layer formation regions being arranged from the side of the first adjacent cell in sequential order; fourth, fifth, and sixth diffusion layer formation regions including a diffusion layer of the second conductivity type, the fourth, fifth, and sixth diffusion layer formation regions being formed in insular configuration in the surface of the underlying layer and in the underlying layer within the second device formation region, the fourth, fifth, and sixth diffusion layer formation regions being arranged from the side of the second adjacent cell in sequential order; a first contact hole portion formed in the insulating layer for establishing an electrical connection between the first diffusion layer formation region formed on an end of the first device formation region which is closer to the first adjacent cell and the first bit line interconnect layer; and a second contact hole portion formed in the insulating layer for establishing an electrical connection between the fourth diffusion layer formation region formed on an end of the second device formation region which is closer to the second adjacent cell and the second bit line interconnect layer.

Preferably, according to a seventh aspect of the present invention, the semiconductor memory of the sixth aspect further comprises: ground interconnect layers formed in the insulating layer on the surface of the underlying layer between the first contact hole portion of the one cell and the second contact hole portion of the first adjacent cell and on the surface of the underlying layer between the second contact hole portion of the one cell and the first contact hole portion of the second adjacent cell, the ground interconnect layers extending in the second direction, the ground interconnect layers for supplying a common ground potential to the plurality of cells including the one cell and arranged in the second direction.

Preferably, according to an eighth aspect of the present invention, in the semiconductor memory of the seventh aspect, each of the third and sixth diffusion layer formation regions formed on an end of the first device formation region which is closer to the second adjacent cell and on an end of the second device formation region which is closer to the first adjacent cell in each of the plurality of cells is directly electrically connected to one of the ground interconnect layers which is positioned adjacent thereto.

Preferably, according to a ninth aspect of the present invention, in the semiconductor memory of the eighth aspect, each of the plurality of cells comprises: a first access transistor having first and second electrode layers corresponding respectively to the first and second diffusion layer formation regions; and a second access transistor having first and second electrode layers corresponding respectively to the fourth and fifth diffusion layer formation regions, and the semiconductor memory further comprises: a first word line interconnect layer made of the same material as the ground interconnect layers and extending in the second direction so as to cover the plurality of cells, the first word line interconnect layer serving as a word line for the first access transistor of the one cell, the first word line interconnect layer being provided so that a part thereof which lies in the first device formation region within the cell range is disposed in the insulating layer on the surface of the underlying layer between the first and second diffusion layer formation regions, a part thereof which lies in the second device formation region is disposed in the insulating layer on the sixth diffusion layer formation region, and a part thereof which lies in other than the first and second device formation regions is disposed in the insulating layer on the surface of the underlying layer; and a second word line interconnect layer made of the same material as the ground interconnect layers and extending in the second direction so as to cover the plurality of cells, the second word line interconnect layer serving as a word line for the second access transistor of the one cell, the second word line interconnect layer being provided so that a part thereof which lies in the first device formation region within the cell range is disposed in the insulating layer on the third diffusion layer formation region, a part thereof which lies in the second device formation region is disposed in the insulating layer on the surface of the underlying layer between the fourth and fifth diffusion layer formation regions, and a part thereof which lies in other than the first and second device formation regions is disposed in the insulating layer on the surface of the underlying layer.

Preferably, according to a tenth aspect of the present invention, the semiconductor memory of the ninth aspect further comprises: power supply potential interconnect layers formed in the insulating layer between the first contact hole portion of the one cell and the second contact hole portion of the first adjacent cell, the power supply potential interconnect layers extending in the second direction, the power supply potential interconnect layers for supplying a common power supply potential to the plurality of cells including the one cell and arranged in the second direction.

Preferably, according to an eleventh aspect of the present invention, in the semiconductor memory of the tenth aspect, each of the plurality of cells comprises: a first resistance portion layer extending in the insulating layer in the first direction from a part of one of the power supply potential interconnect layer which overlies the first device formation region, the one power supply potential interconnect layer being formed between the second contact hole portion of each cell and the first contact hole portion of the second adjacent cell, the first resistance portion layer containing a first resistance portion; and a second resistance portion layer extending in the insulating layer in the first direction from a part of one of the power supply potential interconnect layer which overlies the second device formation region, the one power supply potential interconnect layer being formed between the first contact hole portion of each cell and the second contact hole portion of the first adjacent cell, the second resistance portion layer containing a second resistance portion.

Preferably, according to a twelfth aspect of the present invention, in the semiconductor memory of the eleventh aspect, each of the plurality of cells further comprises: a gate electrode layer for a first driver transistor made of the same material as the ground interconnect layers and extending in the second direction so as to cover the first and second device formation regions, the gate electrode layer being provided so that a part thereof which lies in the first device formation region is formed in the insulating film immediately over the surface of the underlying layer between the second and third diffusion layer formation regions, and a part thereof which lies in the second device formation region is directly electrically connected to the fifth diffusion layer formation region; a gate electrode layer for a second driver transistor made of the same material as the ground interconnect layers and extending in the second direction so as to cover the first and second device formation regions, the gate electrode layer being provided so that a part thereof which lies in the second device formation region is formed in the insulating film immediately over the surface of the underlying layer between the fifth and sixth diffusion layer formation regions, and a part thereof which lies in the first device formation region is directly electrically connected to the second diffusion layer formation region; a first buried contact portion formed in a position in the insulating layer immediately over the gate electrode layer for the second driver transistor within the first device formation region for establishing an electrical connection between an end of the first high resistance portion layer extending to the position and the gate electrode layer for the second driver transistor; and a second buried contact portion formed in a position in the insulating layer immediately over the gate electrode layer for the first driver transistor within the second device formation region for establishing an electrical connection between an end of the second high resistance portion layer extending to the position and the gate electrode layer for the first driver transistor.

Preferably, according to a thirteenth aspect of the present invention, in the semiconductor memory of the sixth aspect, each of the plurality of cells comprises: a diffusion layer of the first conductivity type different from the diffusion layer of the second conductivity type and extending from respective surfaces of the first and fourth diffusion layer formation regions forming respective bottoms of the first and second contact hole portions toward the inside of the diffusion layer of the second conductivity type.

Preferably, according to a fourteenth aspect of the present invention, in the semiconductor memory of the thirteenth aspect, each of the third and sixth diffusion layer formation regions comprises a pair of diffusion layers of the second conductivity type different from the diffusion layers of the first and second conductivity types and serving as source/drain regions of a transistor.

Preferably, according to a fifteenth aspect of the present invention, in the semiconductor memory of the twelfth aspect, each of the plurality of cells comprises: a diffusion layer of the first conductivity type different from the diffusion layer of the second conductivity type and extending from respective surfaces of the first and fourth diffusion layer formation regions forming respective bottoms of the first and second contact hole portions toward the inside of the diffusion layer of the second conductivity type.

Preferably, according to a sixteenth aspect of the present invention, in the semiconductor memory of the fifteenth aspect, the third diffusion layer formation region comprises: a first portion of the underlying layer positioned immediately under the second word line interconnect layer; a first diffusion layer of the second conductivity type also used as a first electrode layer of the first driver transistor; and a second diffusion layer of the second conductivity type opposed to the first diffusion layer, with the first portion of the underlying layer therebetween, the second diffusion layer being connected to one of the ground interconnect layers which is closer to the second adjacent cell, and the sixth diffusion layer formation region comprises: a second portion of the underlying layer positioned immediately under the first word line interconnect layer; a third diffusion layer of the second conductivity type also used as a first electrode layer of the second driver transistor; and a fourth diffusion layer of the second conductivity type opposed to the third diffusion layer, with the second portion of the underlying layer therebetween, the fourth diffusion layer being connected to one of the ground interconnect layers which is closer to the first adjacent cell.

Preferably, according to a seventeenth aspect of the present invention, in the semiconductor memory of the fifth aspect, respective widths of the first and second device formation regions in cross section parallel to a plane containing the first and second directions are decreased in the first direction.

Preferably, according to an eighteenth aspect of the present invention, in the semiconductor memory of the seventeenth aspect, respective configurations of the first and second device formation regions in the cross section are symmetrical with respect to a line extending in the first direction.

Preferably, according to a nineteenth aspect of the present invention, in the semiconductor memory of the eighteenth aspect, the first and second device formation regions are configured to be symmetrical about a center point within the cell range.

In accordance with the first aspect of the present invention, since each cell is positioned in translated relation in both the first and second directions, the layout structures of the cells may be independent and set to a common structure. The cell layout structure of the first aspect is more simplified than the conventional cell layout structure which is positioned in translated relation only in the second direction, and provides to each cell an allowance for reductions in the number of interconnect layers and in the number of connection holes therein.

In accordance with the second aspect of the present invention, the cell layout structure which is symmetrical with respect to the point provides to each cell the allowance and structure for the reductions in the number of interconnect layers and in the number of connection holes in the cell layout, creating the possibility of simplification of the process and structure.

In accordance with the fifth aspect of the present invention, the conventional structure wherein the cells share the device formation regions is not employed, but the two independent device formation regions are provided to each cell. This allows the formation of the portion wherein the device formation regions are not formed, that is, the available space portion on and in the underlying surface between adjacent cells. The available space portion may be used for other interconnect layers of each cell.

In accordance with the sixth aspect of the present invention, the conventional structure wherein the contact hole portion for connection between the bit line and the device formation region is shared between adjacent cells is not employed, but the two independent contact hole portions are provided to each cell. This allows the provision of a portion for the interconnect layer required for the adjacent cells between the first contact hole portion of one of the adjacent cells and the second contact hole portion of the other adjacent cell. Such an available space portion may be used to reduce the number of interconnect layers by one.

In accordance with the seventh aspect of the present invention, the ground interconnect layers serving as the first-level interconnect layer may be formed on the underlying surface between the first contact hole portion and the second contact hole portion. This structure may have fewer interconnect layers than the conventional structure including the ground interconnect layers serving as the second-level interconnect layer. Thus, the layout structure and process of each cell may be simplified. In addition, the ground interconnect layers of the present invention, similar to the conventional ground interconnect layers, extend in parallel in the second direction, maintaining the advantage of the conventional layout that the ground interconnect layers are formed stably in terms of the process.

In accordance with the eighth aspect of the present invention, the ground interconnect layers are directly connected to the diffusion layer in the device formation regions of each cell. This provides a much smaller step at the connection than the conventional step to decrease the plug resistance in the step portion to a negligible order. In addition, since the above described connection is a connection between the first-level portion and the device formation region, the connection hole for connection between the gate layer of the transistor in the cell and the device formation region may be used for a hole for the above described connection in terms of the process. This reduces the number of fabrication steps in the process and reduces the number of connection holes by one in terms of structure.

In accordance with the ninth aspect of the present invention, the ground interconnect layers and the word line in each cell are made of the same material, extend in parallel in the second direction, and serve as the first-level interconnect layer. The ground interconnect layers and the word line may be formed simultaneously in the process, and the process is simplified. In addition, the layout structure may maintain the conventional advantages. That is, since the word line has a decreased resistance, the ground interconnect layers themselves may have a decreased resistance. Parallel interconnection achieves the stable configuration of the word line and ground interconnect layers.

In accordance with the tenth aspect of the present invention, the power supply potential interconnect layers of each cell may be provided as the second-level interconnect layer. These interconnect layers extending in parallel in the second direction do not have the conventional portion of the reduced width but have a stable configuration without difficulty. The resistance of the power supply potential interconnect layers of each cell are much lower than that of the prior art.

In accordance with the eleventh aspect of the present invention, since the high resistance portions of each cell are perpendicular to the corresponding power supply potential interconnect layers, the intersection may be tailored to the layout pattern without the increase in width at the intersection in the process. This stabilizes the configuration and dimensions of the high resistance portion layers, achieving the correct resistance value of the high resistance portion layers as designed.

In accordance with the twelfth aspect of the present invention, the two high resistance portion layers extending in the first direction are formed in each cell, and no other interconnect layers are present in the same plane. Thus, increased is the distance between the respective buried contact portions and the end of the corresponding high resistance portion layers, that is, the cover margin of the respective buried contact portions. This provides the stable configuration of the buried contact portions.

In accordance with the thirteenth and fifteenth aspects of the present invention, the diffusion layer of the first conductivity type is provided in the diffusion layer of the second conductivity type immediately under each contact hole portion. Then, the layer of the first conductivity type, the layer of the second conductivity type, and the underlying layer of the first conductivity type are formed in order immediately under each contact hole portion. These layers constitute a bipolar transistor. This achieves the stacked SRAM layout structure using the layout structure of the high resistance load SRAM as it is, for example. Therefore, one layout structure may be efficiently used as the layout structures of a plurality of types of semiconductor memories.

In accordance with the seventeenth aspect of the present invention, since the width of the device formation regions in each cell is reduced in the first direction, the transistor characteristics required for various types of semiconductor memories may be accomplished. For the high resistance load SRAM, for example, the driving force of the access transistors may be decreased while the driving force of the driver transistors is increased. For the stacked SRAM, the collector-emitter breakdown voltage of a PNP bipolar transistor may be ensured without the increase in $\beta$ ratio.

In accordance with the eighteenth and nineteenth aspects of the present invention, the size of each cell may be reduced while the effects of the twelfth aspect are maintained.

In accordance with the fourteenth and sixteenth aspects of the present invention, transistors are formed in the third and sixth diffusion layer formation regions. Therefore, the present invention readily implements the layout structure of the stacked SRAM using the layout structure applicable to the high resistance load SRAM without fundamentally changing the latter layout structure.

It is therefore a primary object of the present invention to overcome the first to fourth drawbacks of a conventional layout structure which have been described in BACKGROUND OF THE INVENTION while maintaining the advantages (1) to (3) of the conventional layout structure which have been described in BACKGROUND OF THE INVENTION.

It is another important object of the present invention to provide a layout structure which efficiently implements a novel SRAM cell circuit.

It is still another object of the present invention to provide a correct field configuration to satisfy actually required performance of transistors in each cell and to give consideration to reduction in cell size in satisfying all such effects.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4A and 4B are cross-sectional views of the layout structure of the semiconductor memory according to the first preferred embodiment of the present invention;

DESCRIPTION OF THE PREFERRED EMBODIMENTS

First Preferred Embodiment

Figure 1:
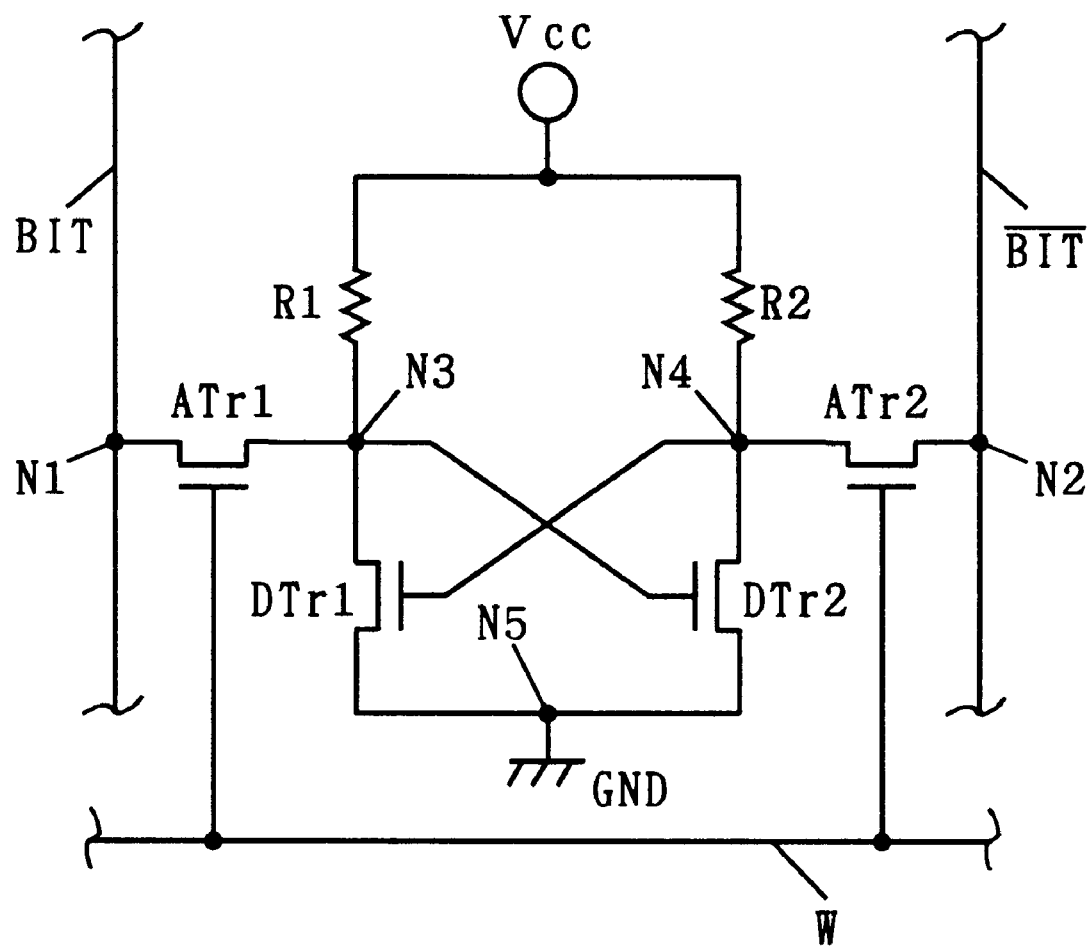
FIG. 1 is a circuit diagram of a high resistance load SRAM cell.

FIG. 1 is a circuit diagram of an SRAM which is to be implemented by a semiconductor memory according to a first preferred embodiment of the present invention. The SRAM circuit of FIG. 1 is a high resistance load SRAM which has been known in the art. In FIG. 1, the reference character BIT designates a bit line (first bit line); $\overline{\text{BIT}}$ designates a bit line (second bit line); ATr1 and ATr2 designate first and second access transistors, respectively; W designates a word line; $V_{CC}$ designates a high power supply potential; GND designates a ground potential; R1 and R2 designate first and second high resistances, respectively; DTr1 and DTr2 designate first and second driver transistors, respectively; and N1 to N5 designate nodes corresponding to connection holes in a layout structure to be described later. The term "high resistance" means a load resistance having a high resistance value.

Figure 2:
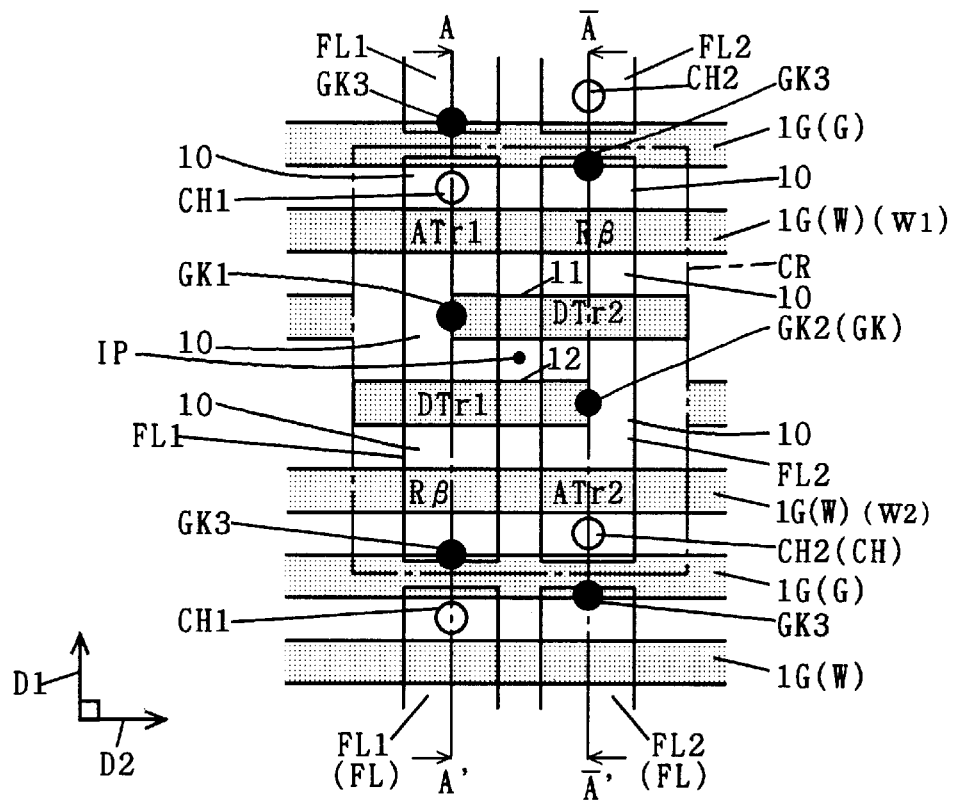
FIGS. 2 and 3 are plan views of a layout structure of a semiconductor memory according to a first preferred embodiment of the present invention.
Figure 3:
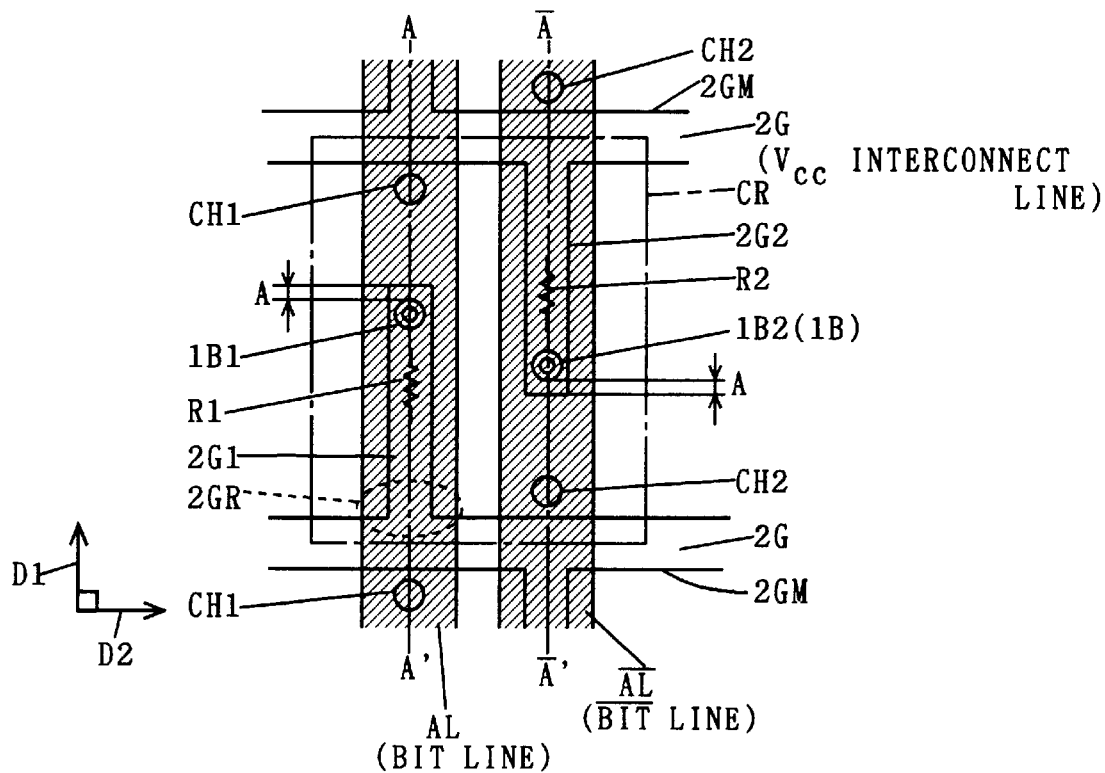
Figure 4A:
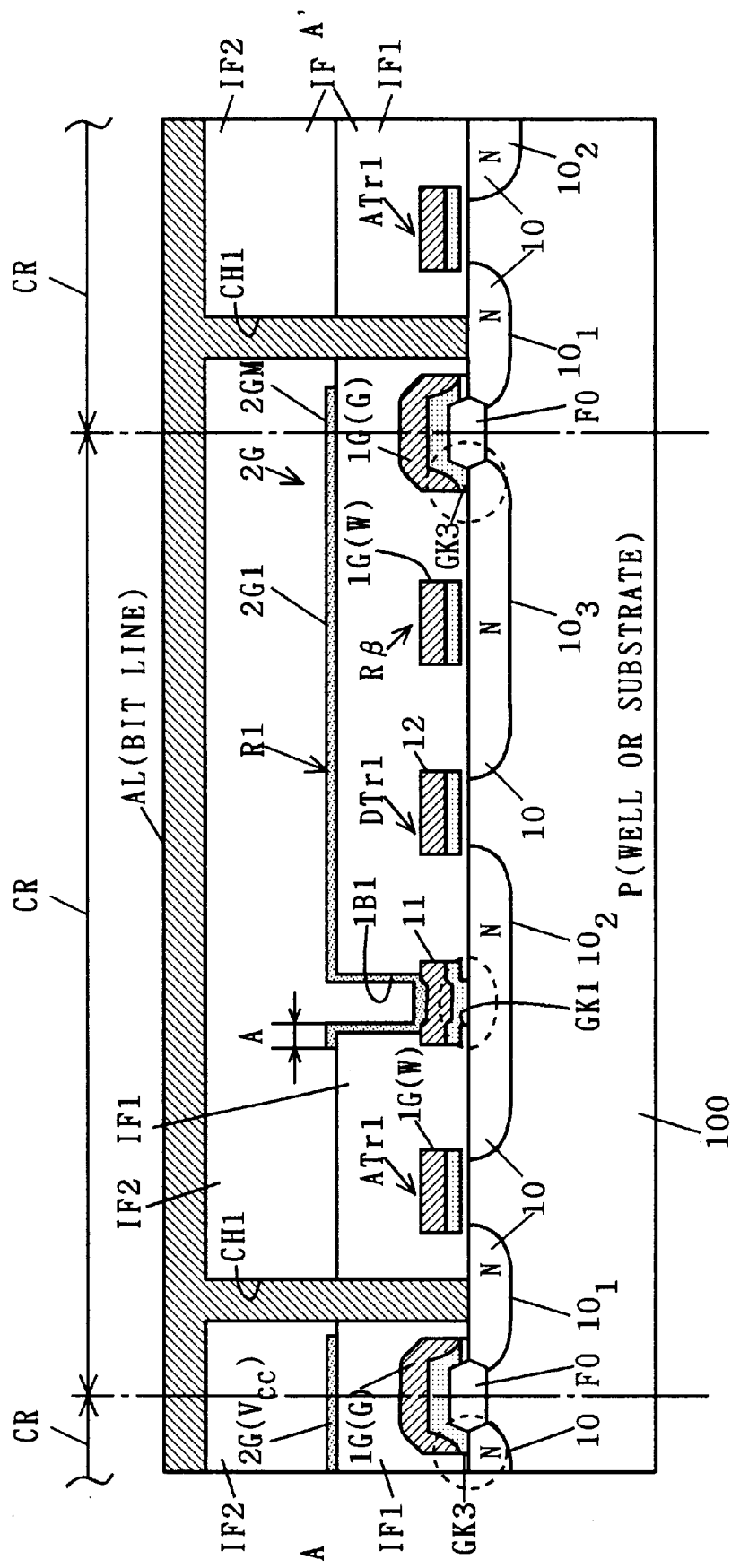

FIGS. 2 and 3 are plan views of a layout structure according to the first preferred embodiment for implementing the SRAM of FIG. 1. FIG. 4A is a longitudinal cross-sectional view of a first field taken along the line A-A' of FIGS. 2 and 3. FIG. 4B is a longitudinal cross-sectional view of a second field taken along the line $\overline{\text{A-A}}$' of FIGS. 2 and 3. The longitudinal cross section of the second field of FIG. 4B is reverse to the longitudinal cross section of FIG. 4A. In FIGS. 2 and 3, D1 denotes a first direction (bit line direction), and D2 denotes a second direction (word line direction) perpendicular to the first direction D1. In FIGS. 4A and 4B, ATr1, ATr2, DTr1, and DTr2 denote regions in which the transistors shown in FIG. 1 are to be formed, particularly channel regions, and gate oxide film regions and gate electrode regions on the channel regions.

The reference character 1G(G) designates WSi/polysilicon interconnect layers for a GND line; and 1G(W) designates WSi/polysilicon interconnect layers for the word line W. The interconnect layers 1G(G) and 1G(W) are interconnect layers in a first level produced in the same fabrication step and are generically referred to as first-level (WSi/polysilicon) interconnect layers 1G. The WSi/polysilicon interconnect layers are used herein to decrease the wiring resistance of the word line (and accordingly the GND line). The reference character 2G designates polysilicon interconnect layers for interconnection of the high potential power supply $V_{CC}$ and referred to also as second-level (polysilicon) interconnect layers.

Connection holes GK comprise three types of connection holes GK1 to GK3 for each cell. The first connection hole GK1 is a hole for connection between a first field FL1 (or an N-type diffusion layer 10) and a gate interconnect layer 11 of the second driver transistor DTr2. The second connection hole GK2 is a hole for connection between a second field FL2 (or the N-type diffusion layer 10) and a gate interconnect layer 12 of the first driver transistor DTr1. The third connection holes GK3 are holes for connection between corresponding fields FL (or the N-type diffusion layer 10) and the first-level GND interconnect layers 1G(G).

First and second contact holes CH1 and CH2 are holes for contact between the corresponding fields FL (or the N-type diffusion layer 10) and third-level aluminum interconnect layers BIT and $\overline{\text{BIT}}$ for bit lines. The contact holes CH1 and CH2 are generically referred to as contact holes CH. The contact holes CH and plug layers for filling the contact holes CH are generically defined as a "contact portion".

The relation between the connection holes GK1 to GK3 and contact holes CH, and the nodes N1 to N5 of FIG. 1 is as follows: the node N1 corresponds to the first contact hole CH1; the node N2 corresponds to the second contact hole CH2; the node N3 corresponds to the first connection hole GK1; the node N4 corresponds to the second connection hole GK2; and the node N5 corresponds to the third connection hole GK3.

The first and second fields FL1 and FL2 are generically referred to as fields FL. The "field" herein corresponds to a "device formation region", and the term "field" is used hereinafter to mean the same.

The reference character CR designates the range of one cell.

In FIGS. 4A and 4B, the reference numeral 100 designates a semiconductor substrate or well of a first conductivity type (P type herein) also referred to as an "underlying layer". The N type is a second conductivity type.

The reference characters IF1 and IF2 designate first and second interlayer insulating films (e.g., $SiO_2$ films), respectively, which are generically referred to as interlayer insulating films IF.

High resistance portions R1 and R2 shown in FIGS. 4A and 4B represent portions wherein the high resistance loads R1 and R2 of FIG. 1 are to be formed. These portions R1 and R2 are formed by making undoped regions in respective parts of the interconnect layers 2G for the high power supply potential $V_{CC}$, that is, the high resistance formation layers 2G1 and 2G2 extending in the first direction D1 in parallel to the underlying surface, as in the background art technique.

In FIG. 3, the reference characters AL and $\overline{AL}$ designate third-level aluminum interconnect layers corresponding to the bit line (BIT) and the $\overline{bit}$ line ($\overline{BIT}$) of FIG. 1, respectively.

The reference characters 1B1 and 1B2 designate first and second buried contacts, respectively, which are also generically referred to as buried contacts 1B. The buried contacts 1B and plug layers formed therein (See FIGS. 4A, 4B, and 5B) are generically defined as a "buried contact portion".

With reference to FIGS. 4A and 4B, an insulating film corresponding to a gate oxide film is provided between the diffusion layer 10 connected to the first contact hole CH1 and the GND interconnect layer 1G(G).

In the first preferred embodiment, it is apparent from FIGS. 2, 3, 4A and 4B that six N-type diffusion layers 10 are formed in insular configuration in the surface of the underlying layer 100 and inside the underlying layer 100. These diffusion layers 10 are defined by numbering for distinction therebetween in a manner to be described below. Referring to FIGS. 4A and 4B, the diffusion layer 10 connected to the first contact hole closer to a first adjacent cell and serving as a first electrode layer of the first access transistor ATr1 in the first field FL1 is defined as a "first diffusion layer formation region". The diffusion layer 10 lying to the right of the first diffusion layer formation region and serving as a second electrode layer of the first access transistor ATr1 and as a first electrode layer of the first driver transistor DTr1 in the first field FL1 is defined as a "second diffusion layer formation region". The diffusion layer 10 serving as a second electrode layer of the first driver transistor DTr1 and connected directly to the ground interconnect layer 1G(G) in the third connection hole GK3 in the first field FL1 is defined as a "third diffusion layer formation region". In the second field FL2, the diffusion layer 10 connected to the second contact hole CH2 closer to a second adjacent cell and serving as a first electrode layer of the second access transistor ATr2 is defined as a "fourth diffusion layer formation region". The diffusion layer 10 serving as a second electrode layer of the second access transistor ATr2 and as a first electrode layer of the second driver transistor DTr2 in the second field FL2 is defined as a "fifth diffusion layer formation region". The diffusion layer 10 serving as a second electrode of the second driver transistor DTr2 and connected directly to the ground interconnect layer 1G(G) in the connection hole GK3 closer to the first adjacent cell in the second field FL2 is defined as a "sixth diffusion layer formation region".

As compared with the prior art structure of FIGS. 14 and 15, the layout structure of the semiconductor memory of the first preferred embodiment shown in FIGS. 2, 3, 4A and 4B has features to be described below.

Figure 14:
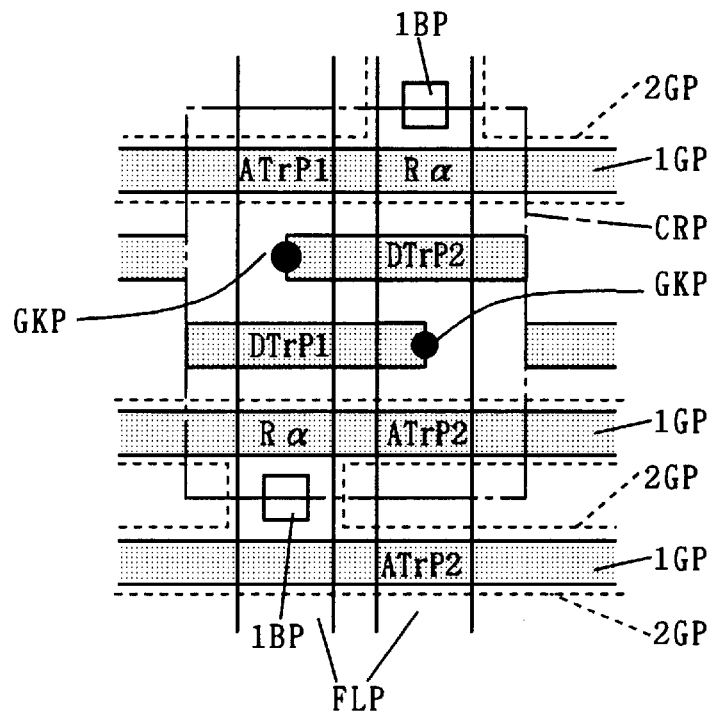
FIGS. 14 and 15 are plan views of a prior art layout of a high resistance load SRAM cell.
Figure 15:
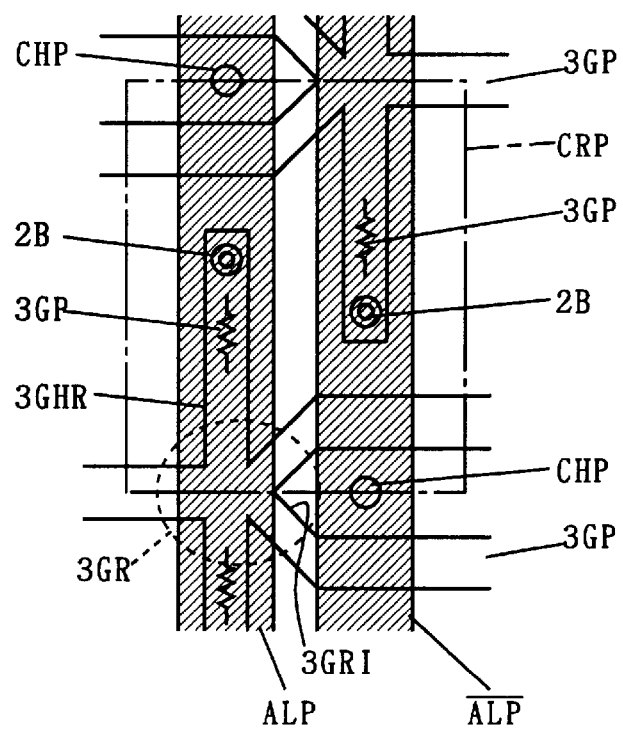
Figure 18:
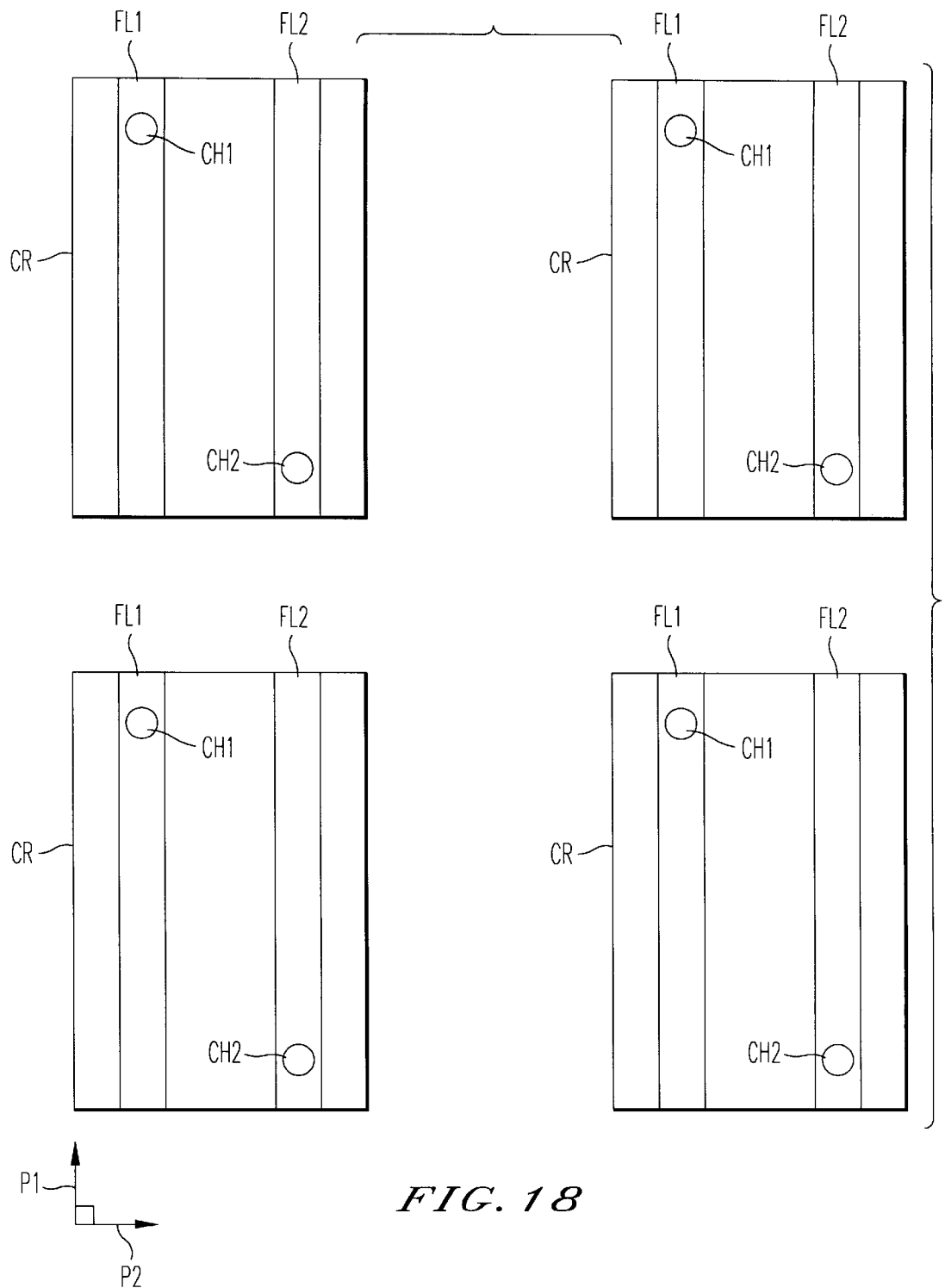
FIG. 18 is a top view of a plural cell array.

(1) The contact holes CH and fields FL which have been shared between the cells vertically adjacent to each other in plan views of FIGS. 14 and 15 are divided between the cells vertically adjacent to each other in plan views of FIGS. 2 and 3. The adjacent cells are positioned in translated relation in the first and second directions D1 and D2. Then, each cell (CR) has the two inherent contact holes CH1 and CH2 and the two inherent fields FL1 and FL2 as illustrated in FIG. 18.

(2) The first-level WSi/polysilicon interconnect layers 1G which have been used only for word lines are provided as the interconnect layers for the GND line (referred to simply as GND interconnect layers) 1G(G) on surface regions of the underlying layer 100 which are produced by the use of the structure of the feature (1) and which are located between the first contact hole CH1 of the cell of interest and the second contact hole CH2 of an upper adjacent cell (first adjacent cell) in plan views of FIGS. 2 and 3 and between the second contact hole CH2 of the cell of interest and the first contact hole CH1 of a lower adjacent cell (second adjacent cell). The first-level interconnect layers are generically designated by the reference character 1G. The first-level interconnect layers 1G used as the interconnect layers 1G(W) for the word line as in the prior art technique must have a low resistance for suppression of delays of the word line W of FIG. 1 (delays due to the parasitic capacitance of the access transistors and the resistive element of the word line). For this purpose, the interconnect layers 1G(W) are the WSi/polysilicon interconnect layers. In the first preferred embodiment, the GND interconnect layers 1G(G) are made of the same material as the interconnect layers 1G(W) and fabricated in the same step as the interconnect layers 1G(W), and are accordingly low resistance interconnect layers. In addition, the first preferred embodiment has the advantage of the prior art technique that the both layers 1G(G) and 1G(W) extend linearly in parallel in the word line direction D2.

(3) The first and second connection holes GK1, GK2 for connection between the gate electrode layers 11, 12 of the second and first driver transistors DTr2, DTr1 and the corresponding fields FL1, FL2 are used to form the connection holes for connection between the GND interconnect layers 1G(G) and the fields FL (or the N-type diffusion layers 10). These connection holes are the above described third connection hole GK3. The connection holes GK1 to GK3 are fabricated in the same step. Then, the dimension of the step of the third connection holes GK3 equals only the thickness of the gate oxide film (about not more than 10 nm) which is about one order of magnitude less than the dimension of the step of the prior art connection hole 1BP (about 100 to 150 nm). The dimension of the step in the first preferred embodiment is so small that it may be ignored. This significantly decreases the plug resistance in the connection holes GK3 to provide a lower resistance, or a contact resistance having a lower resistance value (See FIGS. 5A and 5B in simplified form). The third feature is described more specifically hereinafter.

Figure 5A:
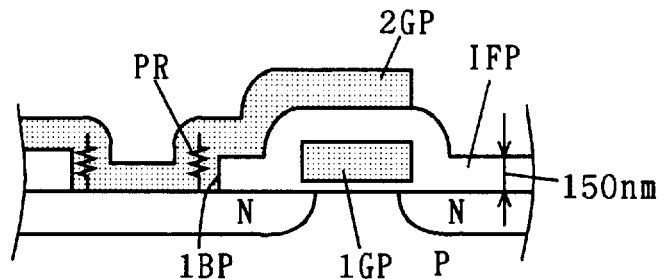
FIGS. 5A and 5B are cross-sectional views for comparison between GND contact structures.

In the background art layout structure as illustrated in FIG. 5A, an interlayer insulating film IFP ($SiO_2$) for etching stop must have a thickness of 100 to 150 nm. This limits the decrease in depth of the connection hole 1BP. The potential of the GND interconnect layer 2GP should be 0 V. However, the plug resistance due to the step of the connection hole 1BP develops a potential difference which in turn impairs the stability of the cell.

Figure 5B:
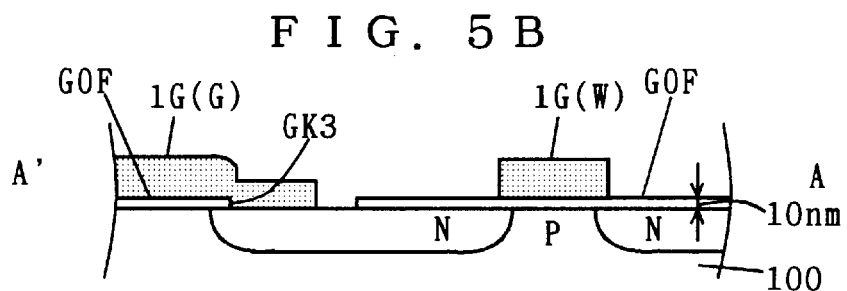

On the other hand, in the layout structure of the present invention as shown on an enlarged scale in FIG. 5B, the word line interconnect layer 1G(W) of WSi/poly Si is used for the GND line. Therefore, the synergistic effect of the decrease in resistance of the GND interconnect layer 1G(G) itself and the decrease in plug resistance to a negligible level in the connection hole GK3 allows the GND interconnect line having a very low resistance.

The novel layout structure as above described is adopted in the first preferred embodiment wherein only three levels of interconnect layers (1G, 2G, AL ($\overline{\text{AL}}$)) are required but a fourth-level interconnect layer is not required although the background art technique has required four levels of interconnect layers (1GP, 2GP, 3GP, ALP ($\overline{\text{ALP}}$)). In addition, the number of connection holes may be reduced from four (GKP, 1BP, 2B, CHP) of the background art to three (GK, 1B, CH). This permits the layout structure of the first preferred embodiment to decrease the number of interconnect layers and the number of connection holes, with the advantages (1) to (3) of the conventional layout structure maintained intactly, to achieve significantly decreased costs. Specifically, the word line interconnect layers 1G(W) (the gates of the access transistors ATr1, ATr2), the gate layers 12, 11 of the driver transistors DTr1, DTr2, and the GND interconnect layers 1G(G) extend in the same longitudinal direction (the second direction D2) in parallel, thereby providing good controllability of the gate length and of the configuration of the GND interconnect layers. The GND interconnect layers may have stable transistor characteristics and a stable low resistance value.

Figure 16A:
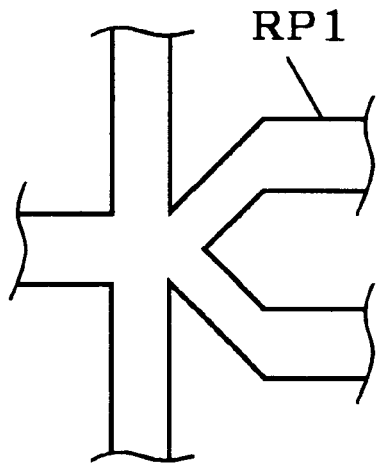
FIGS. 16A and 16B are schematic plan views of a finished form of a resist for formation of a layout of a high resistance portion layer.
Figure 16B:
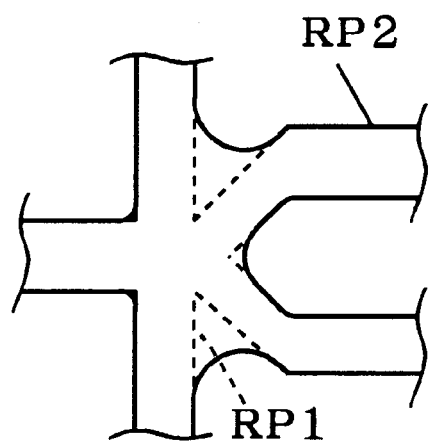
Figure 17:
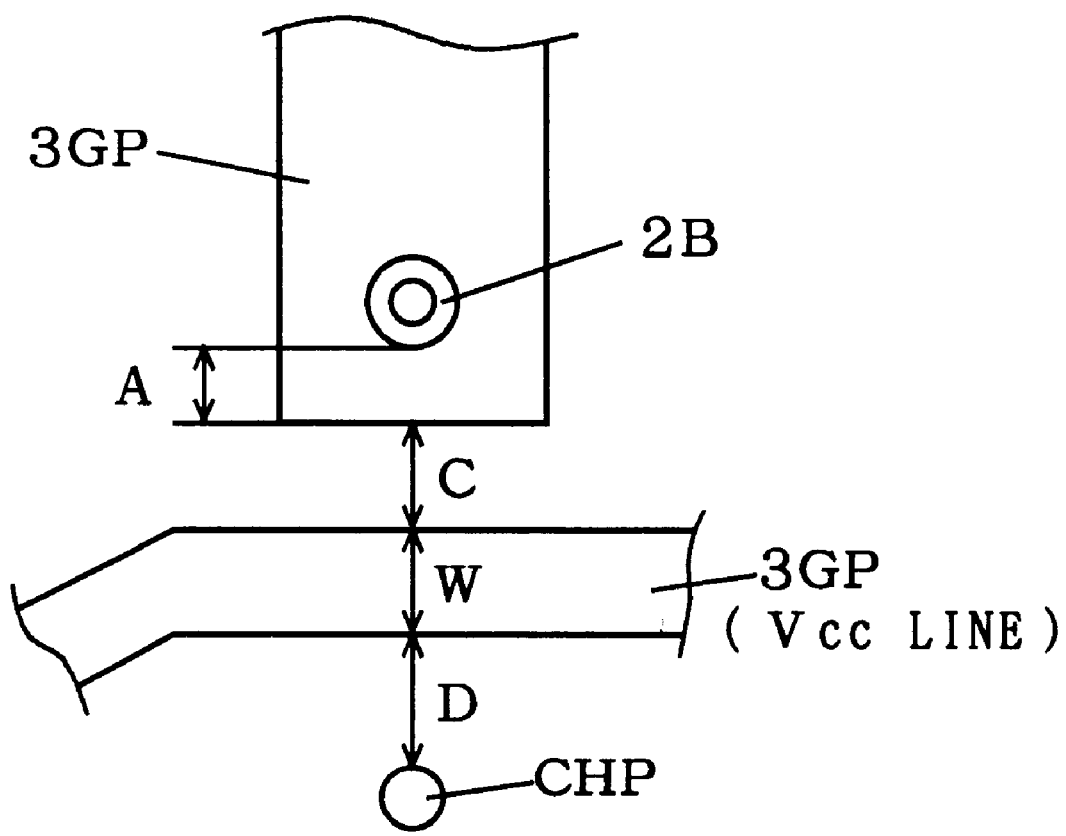
FIG. 17 is a view for indication of a background art problem.

Further, the second-level polysilicon interconnect layers 2G ($V_{CC}$ interconnection) may be formed in a region (available space region) created between the contact holes CH of the cells vertically adjacent to each other in plan view. Thus, as shown in FIG. 3, main portions 2GM of the second-level interconnect layers 2G which constitute the $V_{CC}$ interconnect lines do not have rounded corners as formed in the background art technique shown in FIGS. 16A and 16B but have a substantially linear shape. In addition, first and second high resistance portion layers 2G1, 2G2 extending from the main portions 2GM on the respective fields FL in the first direction D1 in parallel to the underlying surface may be formed substantially at right angles to the main portions 2GM ($V_{CC}$ interconnect lines) of the interconnect layers 2G. The main portions 2GM constituting the $V_{CC}$ interconnect lines and the high resistance portion layers 2G1, 2G2 may be provided in stable configuration. The achievement of the stable configuration allows correct prediction of the number of sheets contained in a region to be formed in the high resistance portion layers 2G1, 2G2 during fabrication, permitting the production of the high resistance loads R1 and R2 as designed in predetermined portions of the high resistance portion layers 2G1, 2G2.

In this fashion, the stable high resistances (R1, R2) in the high resistance portion layers 2G1, 2G2 are accomplished.

Additionally, the third-level interconnect layers 3GP ($V_{CC}$ interconnect lines) which have been provided between the connection holes 2B and the contact holes CHP in the prior art technique (FIG. 15) are eliminated in the first preferred embodiment. The present invention is advantageous in that the second-level interconnect layers 2G may have an accordingly sufficient allowance A (FIG. 3) relative to the connection holes 1B.

The first preferred embodiment is characterized in that the cells are arranged in translated relation also in the first direction D1, in that the layout structure in each cell is symmetrical with respect to a center point IP shown in FIG. 2, and in that each cell has two fields FL and two contact holes CH independent from adjacent cells as shown in FIG. 1B. These characteristics accomplish (1) the decrease in cost due to reductions in the number of processes, in the number of interconnect layers, and in the number of connection holes, (2) the decrease in resistance of the GND interconnect layers, (3) the decrease in resistance of the GND contact (plug resistance), (4) stabilization of the resistance of the $V_{CC}$ interconnect layers themselves, (5) stabilization of the high resistance portions (R1, R2), (6) the increase in the cover margin (allowance A) of the connection holes 1B, and (7) improvement in dimension controllability of the first-level interconnect layers 1G.

Second Preferred Embodiment

Figure 6:
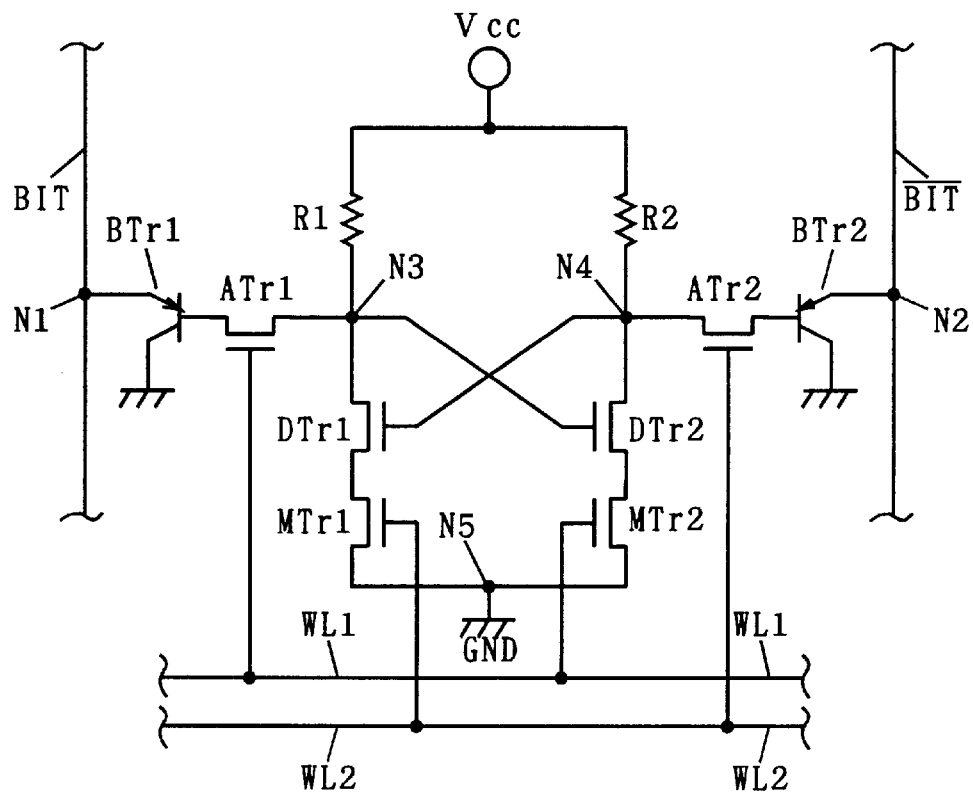
FIG. 6 is a circuit diagram of a stacked SRAM cell.

FIG. 6 is a circuit diagram of a novel SRAM circuit (not known in the art) disclosed in Japanese Patent Application No. 8-325699 (filed on Dec. 5, 1996) the applicant of which is MITSUBISHI DENKI KABUSHIKI KAISHA. The SRAM of FIG. 6 is of a "stacked type" wherein (1) a first PNP bipolar transistor BTr1 is connected between the first bit line BIT and one of the source/drain regions of the first access transistor ATr1, and a second PNP bipolar transistor BTr2 is connected between the second bit line $\overline{\text{BIT}}$ and one of the source/drain regions of the second access transistor ATr2; (2) the gates of the first and second access transistors ATr1, ATr2 are connected to first and second word lines WL1, WL2, respectively; (3) a first N-type MOS transistor MTr1 is connected between one of the source/drain regions of the first driver transistor DTr1 and the ground GND, and a second N-type MOS transistor MTr2 is connected between one of the source/drain regions of the second driver transistor DTr2 and the ground GND; and (4) the gates of the transistors MTr1, MTr2 are connected to the second and first word lines WL2, WL1, respectively.

The second preferred embodiment is not intended to further improve the structure of the novel SRAM circuit shown in FIG. 6 but to provide a layout technique when the circuit of FIG. 6 is implemented on the semiconductor substrate In particular, the second preferred embodiment is intended to argue that the SRAM in the circuit of FIG. 6 as well as the SRAM in the circuit of FIG. 1 may be implemented by utilizing the layout structure disclosed in the first preferred embodiment just as it is.

The operation of the circuit of FIG. 6 is not described in detail in the second preferred embodiment. The feature of the operation of the circuit of FIG. 6 is described below only briefly. The bipolar transistors BTr1, BTr2 drive the potential levels of the corresponding bit lines BIT and $\overline{\text{BIT}}$ depending upon information stored in a cell. As a result, data may be read at high speeds when the power supply voltage is low.

Consideration is given with reference to the above described layout structure shown in FIGS. 2 and 3. (1) If a P-type emitter layer (another diffusion layer of the first conductivity type) is formed to extend from the surface of the semiconductor substrate or underlying layer 100 serving as the bottom of the contact holes CH through to part of the N-type diffusion layer 10 underlying the surface of the semiconductor substrate 100, the N-type diffusion layer 10 and part of the P-type semiconductor substrate 100 which lies under the N-type diffusion layer 10 may be used as a base layer and a collector layer. Then, the PNP transistors BTr1, BTr2 of FIG. 6 may be implemented. (2) Unused regions R β of FIG. 2 may be used for formation of the MOS transistors MTr1, MTr2 of FIG. 6. For this purpose, a third diffusion layer formation region immediately under the regions R β is not made of one N-type diffusion layer but should be divided into two N-type diffusion layers, with the P-type underlying layer therebetween. Only the improvements (1) and (2) on the layout shown in FIGS. 2 and 3 may readily implement the SRAM of the circuit of FIG. 6 as a practical device. More specifically, the SRAM of the circuit of FIG. 6 comprises eight transistors and two high resistances. This SRAM has twice as many transistors as the SRAM of FIG. 1 which comprises four transistors and two high resistances. However, the layout of the cells of the SRAM shown in FIG. 6 may be efficiently achieved on and inside the semiconductor substrate 100 without changes in cell size, in the number of interconnect lines, and in the number of connection holes merely by basically employing the layout structure of FIGS. 2, 3, 4A and 4B as the layout structure for the circuit of FIG. 6 and making the improvements (1) and (2) to the layout structure. Of course, all effects of the layout described in the first preferred embodiment are similarly provided.

Figure 7:
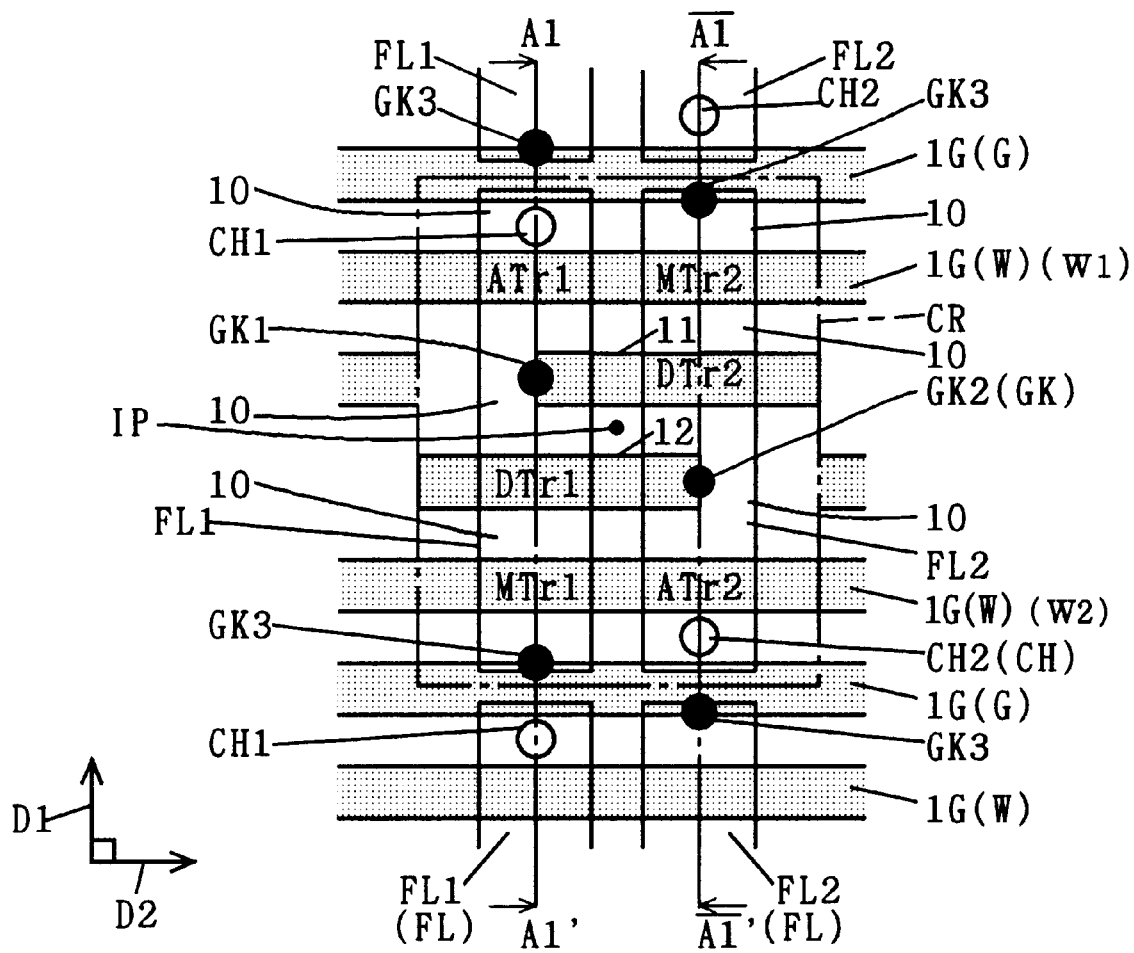
FIG. 7 is a plan view of a layout structure of a SRAM cell according to a second preferred embodiment of the present invention.
Figure 8A:
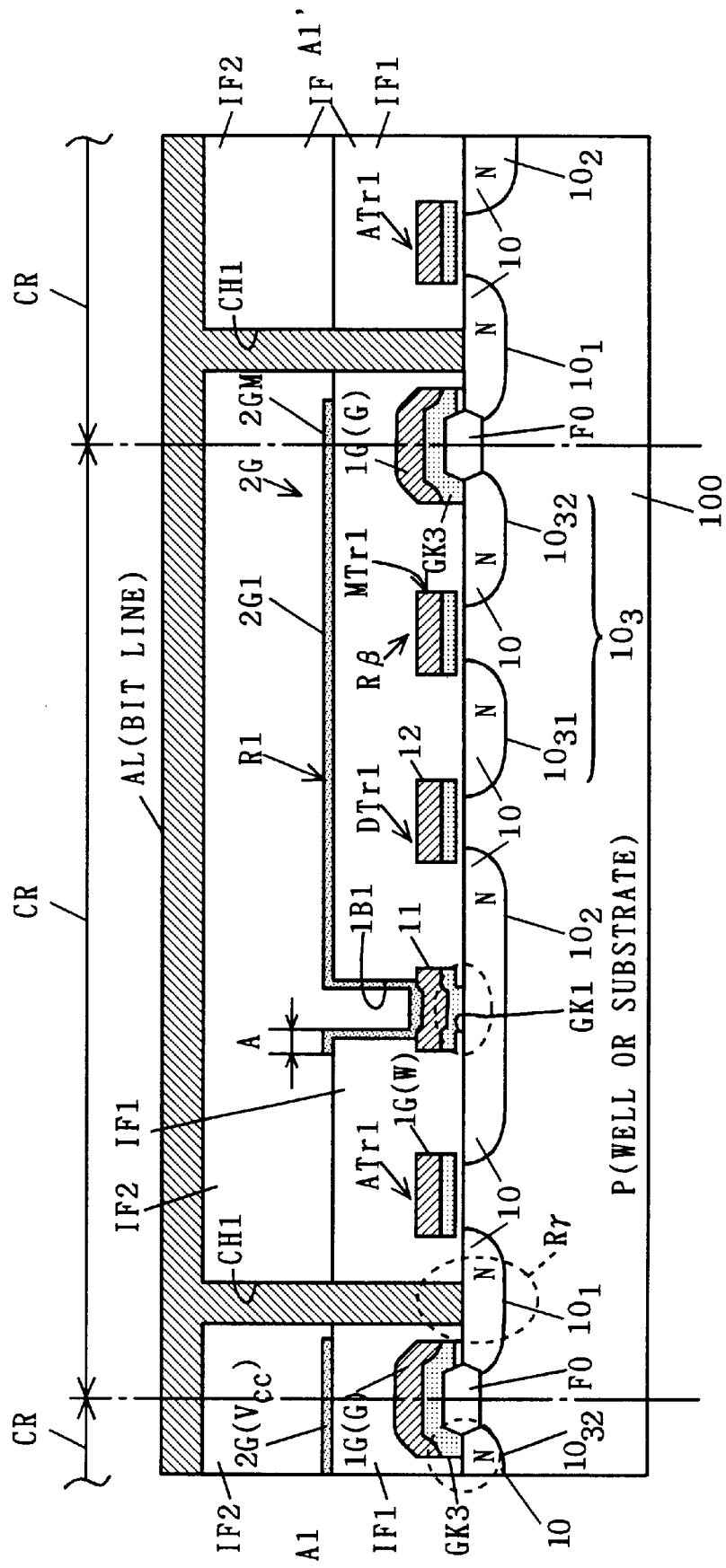
FIGS. 8A and 8B are cross-sectional views of the layout structure of the SRAM cell according to the second preferred embodiment of the present invention.

FIG. 7 is a plan view of such a layout structure corresponding to FIG. 2. FIG. 8A is a longitudinal cross-sectional view of the layout structure taken along the line A1-A1' of FIG. 7, and FIG. 8B is a longitudinal cross-sectional view of the layout structure taken along the line $\overline{\text{A1}}$-$\overline{\text{A1}}$' of FIG. 7.

Figure 8B:
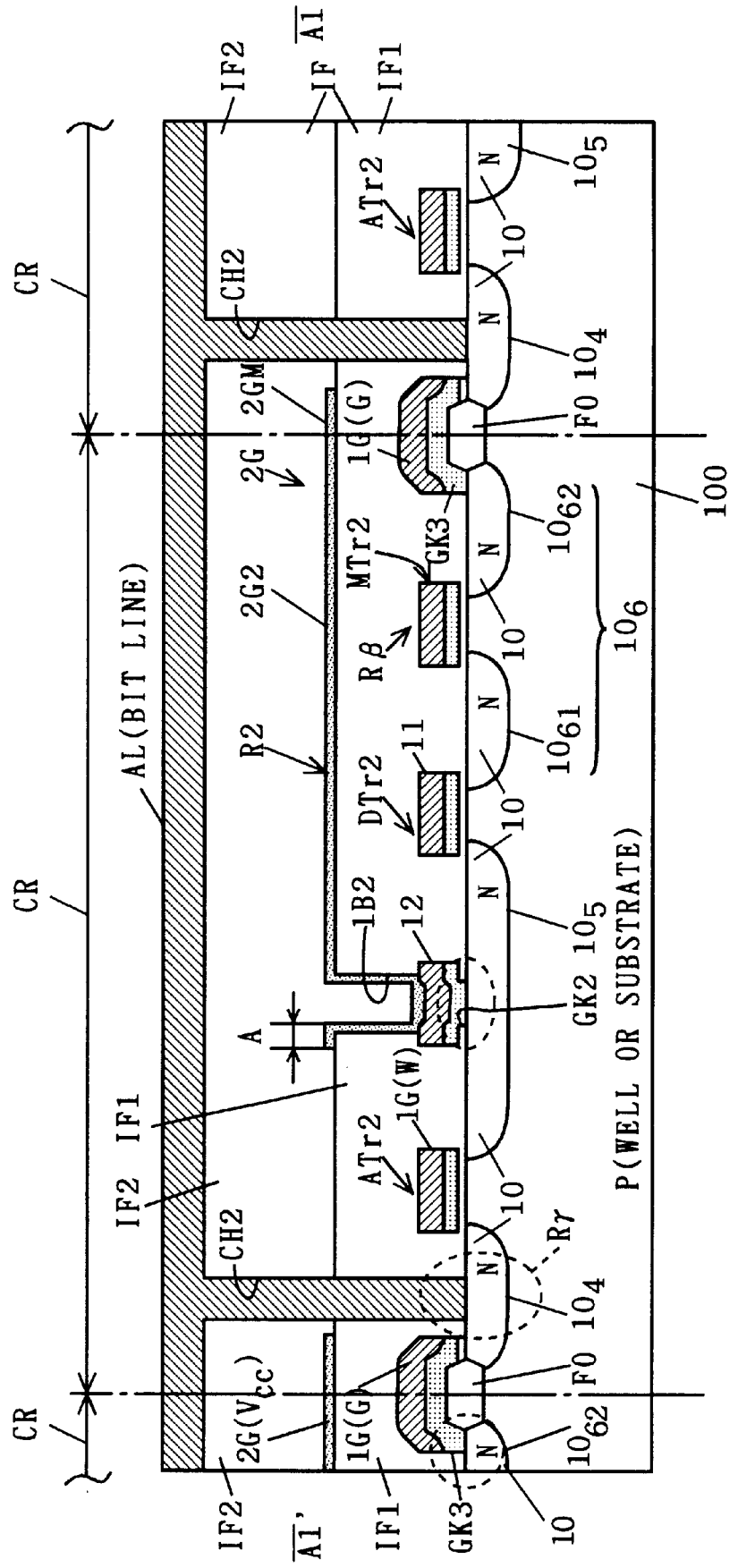
Figure 9A:
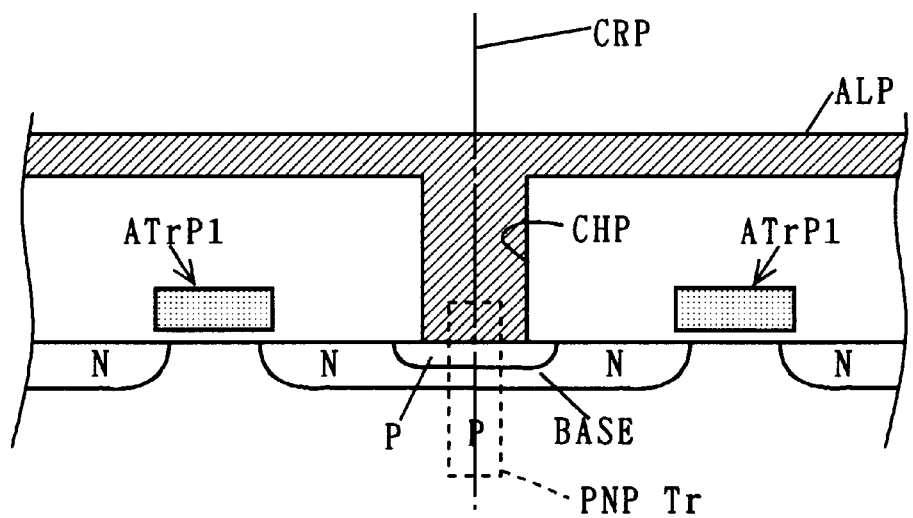
FIGS. 9A and 9B are cross-sectional views for comparison between PNP transistor structures.
Figure 9B:
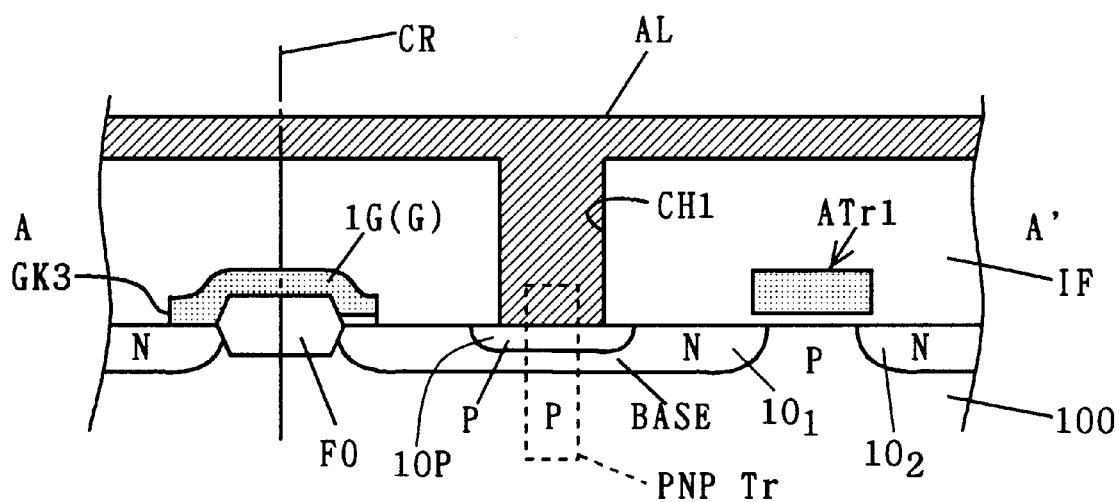

A region portion R γ shown in FIGS. 8A and 8B wherein the PNP transistor BTr1 is to be formed is illustrated on an enlarged scale in FIG. 9B. FIG. 9A illustrates a structure for comparison which would be provided if the PNP transistor of FIG. 6 is intended to be implemented using the conventional layout technique of FIGS. 14 and 15. FIG. 9B illustrates an application of the present invention. It will be understood from FIG. 9A that the application of the conventional layout requires adjacent cells to share the same base region to fail to fundamentally implement the circuit of FIG. 6. In FIG. 9B, the reference character 10P designates a P-type diffusion layer (a second diffusion layer).

In the second preferred embodiment, first and second electrode layers (10$_{31}$, 10$_{32}$) of the first MOS transistor MTr1 and channel portions (100) therebetween (corresponding to a first portion of the underlying layer) together correspond to a "third diffusion layer formation region 10$_3$". Similarly, a "sixth diffusion layer formation region 10$_6$" contains first and second electrode layers (10$_{61}$, 10$_{62}$) of the second MOS transistor MTr2 and channel portions (100) (corresponding to a second portion of the underlying layer).

Appendix

In the first and second preferred embodiments, the load devices of FIGS. 1 and 6 are implemented using the high resistances R1 and R2. Alternatively, MOSFET may be used to implement the load devices, or an additional polysilicon layer may be formed to use thin-film transistors (TFTs) for implementation of the load devices. In this case, high resistance portions substituted for the high resistances R1 and R2 are the channel regions and source/drain regions of the TFTs.

In the circuit of FIG. 6, the layout structure employs the N-type MOS transistor and the PNP transistor. However, the present invention may be applied to a layout structure wherein a combination of a P-type MOS transistor and an NPN transistor constitute the circuit of FIG. 6.

Third Preferred Embodiment

Third to fifth preferred embodiments relate to a technique for improvement in field configuration. Other constructions are not improved.

Figure 10:
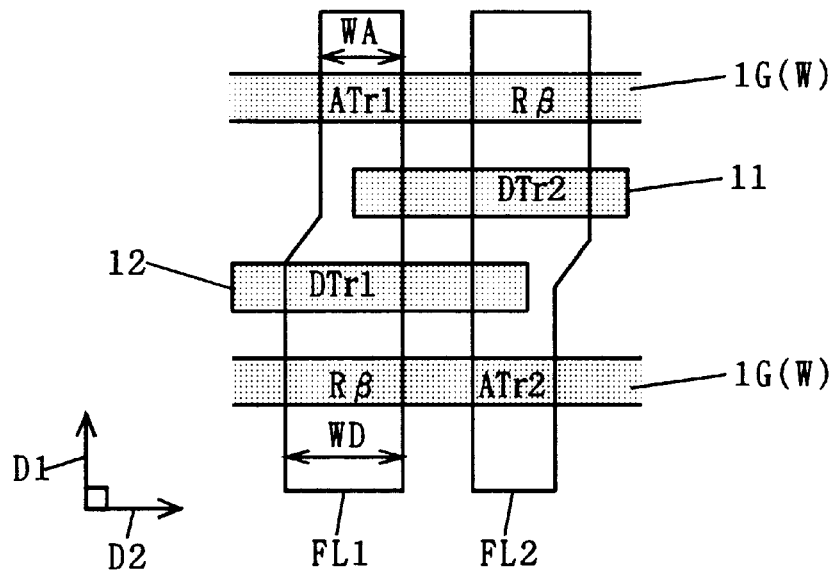
FIGS. 10 through 13 are plan views of field configurations.

In the first and second preferred embodiments, the fields FL are of completely quadrilateral configuration in cross section (a section of the semiconductor memory taken along a plane containing the bit line direction D1 and the word line direction D2). This structure, however, is ideal. In practice, in the SRAM circuit of FIG. 1, the relationship $W_D > W_A$ holds where $W_D$ is the width of the field FL in a region in which the driver transistors DTr1 and DTr2 are to be formed and $W_A$ is the width of the field FL in a region in which the access transistors ATr1 and ATr2 are to be formed since the driving force of the driver transistors DTr1, DTr2 is increased and the driving force of the access transistors ATr1, ATr2 is decreased for setting of a greater cell ratio β (referred to hereinafter as a β ratio). To satisfy the relationship, the fields FL in cross section are slightly deformed in the word line direction D2, that is, have a decreasing width in the bit line direction D1 (an increasing width in the reverse direction) as illustrated in FIG. 10.

This allows the increase in β ratio of the transistors and exhibition of all effects of the first preferred embodiment described above.

Fourth Preferred Embodiment

For the SRAM circuit of FIG. 6, it is not particularly necessary to increase the β ratio, but it is rather necessary to provide a sufficient allowance B (FIG. 11) between the contact hole portion and the wall surface of the field FL in order to insure a collector-emitter breakdown voltage of the PNP transistors BTr1, BTr2.

Figure 11:
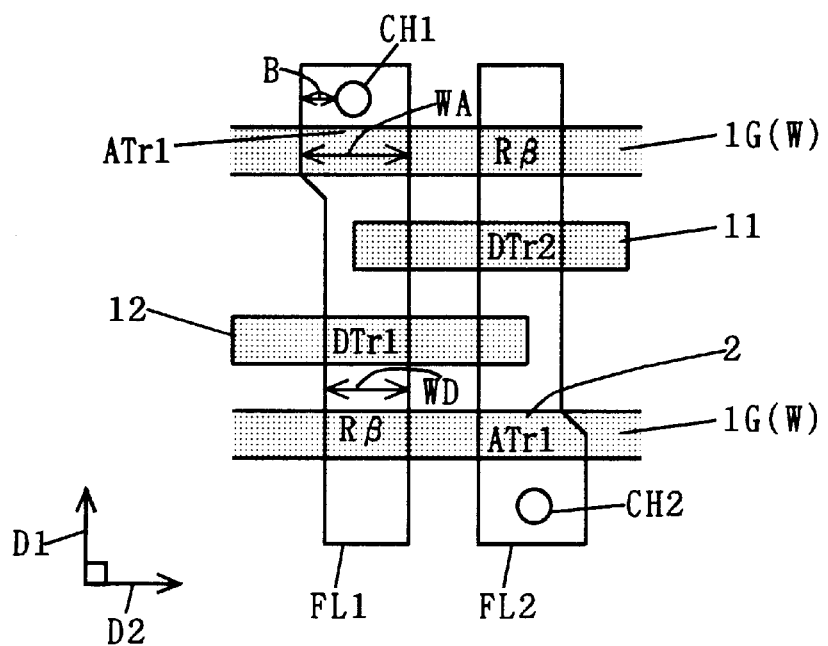

Thus, the fields FL have a cross-sectional configuration shown in FIG. 11 in the fourth preferred embodiment. Therefore, $W_D < W_A$ holds. This allows all effects described in the second preferred embodiment to be satisfied while insuring the collector-emitter breakdown voltage of the PNP transistors by ensuring the field allowance B at a practically required level.

Fifth Preferred Embodiment

Figure 12:
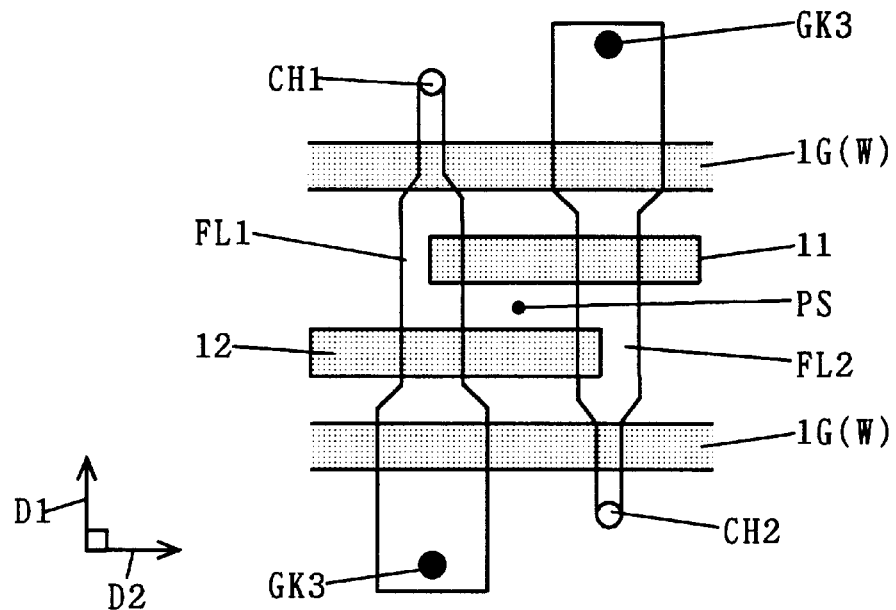
Figure 13:
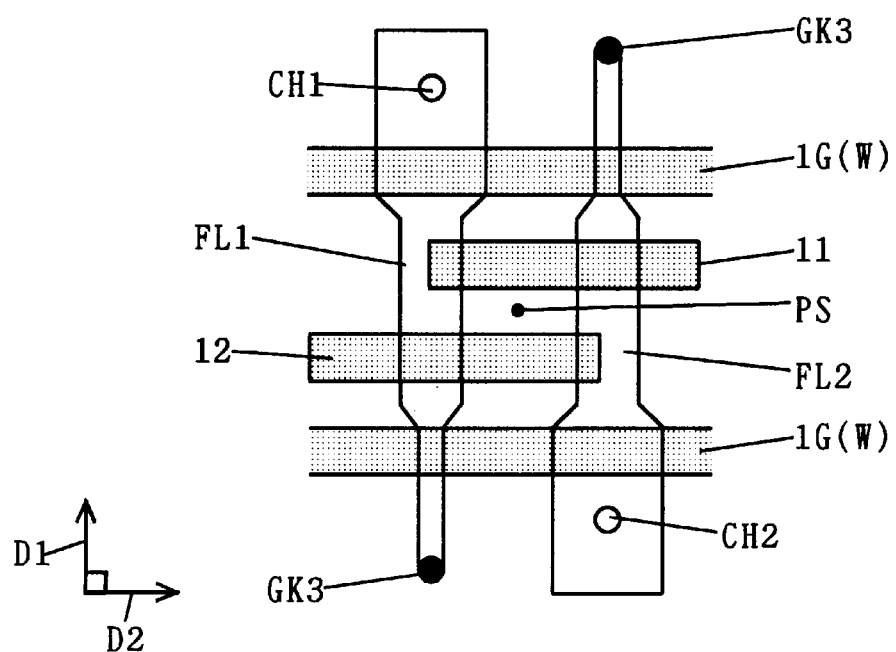

The configurations of the fields FL shown in FIGS. 10 and 11 give rise to a new problem: the increase in size of each cell. To solve the problem, the cross-sectional configuration of each field FL in the fifth preferred embodiment is made symmetrical with respect to a line extending in the bit line direction D1 and is such that the width W is stepwise decreased/increased in the bit line direction D1 as illustrated in respective plan views of FIGS. 12 and 13 in the application of the circuits of FIGS. 1 and 6. Such a structure of the fields FL in each cell may be regarded as being symmetrical with respect to a cell center point PS set as shown in FIGS. 12 and 13.

The use of these structures may effectively prevent the increase in size of each cell while providing the effects of the first and third preferred embodiments or second and fourth preferred embodiments, implementing the layout structure of optimum cells having a minimum size.

While the invention has been described in detail, the foregoing description is in all aspects illustrative and not restrictive. It is understood that numerous other modifications and variations can be devised without departing from the scope of the invention.

What is claimed is:

1. A semiconductor memory comprising:

an underlying layer of a first conductivity type; and a plurality of cells formed on a surface of said underlying layer and in said underlying layer and arranged in a first direction and in a second direction perpendicular to said first direction, wherein each of said plurality of cells is positioned in translated relation in said first and second directions to provide the same layout.

2. The semiconductor memory according to claim 1, wherein said layout of each of said plurality of cells is symmetrical with respect to a center point of each cell.

3. The semiconductor memory according to claim 1, wherein each of said plurality of cells comprises independent first and second device formation regions, wherein respective internal structures of said first device formation region of one of said plurality of cells and its adjacent cell are positioned in translated relation in said first direction, wherein respective internal structures of said second device formation region of said one cell and said adjacent cell are positioned in translated relation in said first direction, and wherein said internal structures of said first device formation region and said second device formation region are arranged in reverse order in said first direction.

4. The semiconductor memory according to claim 1, further comprising:

ground interconnect layers formed on said surface of said underlying layer between one of said plurality of cells and its adjacent cell for supplying a common ground potential to said one cell and said adjacent cell, said ground interconnect layers extending in said second direction and serving as a first-level interconnect layer.

5. The semiconductor memory according to claim 1, further comprising:

an insulating layer formed on said surface of said underlying layer and serving as an interlayer insulating film for each of said plurality of cells; and first and second bit line interconnect layers formed on said interlayer insulating film in opposed relation to each other and extending in said first direction, said first and second bit line interconnect layers being common to said plurality of cells arranged in an array in said first direction, wherein each of said plurality of cells comprises:

a first device formation region positioned immediately under said first bit line interconnect layer on said surface of said underlying layer and in said underlying layer and formed only within a cell range of each cell, said first device formation region extending in said first direction; and a second device formation region positioned immediately under said second bit line interconnect layer on said surface of said underlying layer and in said underlying layer and formed only within a cell range of each cell, said second device formation region extending in said first direction in opposed relation to said first device formation region.

6. The semiconductor memory according to claim 5, wherein cells adjacent to any one of said plurality of cells in said first direction are defined as first and second adjacent cells, and wherein each of said plurality of cells comprises:

first, second, and third diffusion layer formation regions including a diffusion layer of a second conductivity type, said first, second, and third diffusion layer formation regions being formed in insular configuration in said surface of said underlying layer and in said underlying layer within said first device formation region, said first, second, and third diffusion layer formation regions being arranged from the side of said first adjacent cell in sequential order;

fourth, fifth, and sixth diffusion layer formation regions including a diffusion layer of said second conductivity type, said fourth, fifth, and sixth diffusion layer formation regions being formed in insular configuration in said surface of said underlying layer and in said underlying layer within said second device formation region, said fourth, fifth, and sixth diffusion layer formation regions being arranged from the side of said second adjacent cell in sequential order;

a first contact hole portion formed in said insulating layer for establishing an electrical connection between said first diffusion layer formation region formed on an end of said first device formation region which is closer to said first adjacent cell and said first bit line interconnect layer; and a second contact hole portion formed in said insulating layer for establishing an electrical connection between said fourth diffusion layer formation region formed on an end of said second device formation region which is closer to said second adjacent cell and said second bit line interconnect layer.

7. The semiconductor memory according to claim 6, further comprising:

ground interconnect layers formed in said insulating layer on said surface of said underlying layer between said first contact hole portion of said one cell and said second contact hole portion of said first adjacent cell and on said surface of said underlying layer between said second contact hole portion of said one cell and said first contact hole portion of said second adjacent cell, said ground interconnect layers extending in said second direction, said ground interconnect layers for supplying a common ground potential to said plurality of cells including said one cell and arranged in said second direction.

8. The semiconductor memory according to claim 7, wherein each of said third and sixth diffusion layer formation regions formed on an end of said first device formation region which is closer to said second adjacent cell and on an end of said second device formation region which is closer to said first adjacent cell in each of said plurality of cells is directly electrically connected to one of said ground interconnect layers which is positioned adjacent thereto.

9. The semiconductor memory according to claim 8, wherein each of said plurality of cells comprises:

a first access transistor having first and second electrode layers corresponding respectively to said first and second diffusion layer formation regions; and a second access transistor having first and second electrode layers corresponding respectively to said fourth and fifth diffusion layer formation regions, said semiconductor memory further comprising:

a first word line interconnect layer made of the same material as said ground interconnect layers and extending in said second direction so as to cover said plurality of cells, said first word line interconnect layer serving as a word line for said first access transistor of said one cell, said first word line interconnect layer being provided so that a part thereof which lies in said first device formation region within said cell range is disposed in said insulating layer on said surface of said underlying layer between said first and second diffusion layer formation regions, a part thereof which lies in said second device formation region is disposed in said insulating layer on said sixth diffusion layer formation region, and a part thereof which lies in other than said first and second device formation regions is disposed in said insulating layer on said surface of said underlying layer; and a second word line interconnect layer made of the same material as said ground interconnect layers and extending in said second direction so as to cover said plurality of cells, said second word line interconnect layer serving as a word line for said second access transistor of said one cell, said second word line interconnect layer being provided so that a part thereof which lies in said first device formation region within said cell range is disposed in said insulating layer on said third diffusion layer formation region, a part thereof which lies in said second device formation region is disposed in said insulating layer on said surface of said underlying layer between said fourth and fifth diffusion layer formation regions, and a part thereof which lies in other than said first and second device formation regions is disposed in said insulating layer on said surface of said underlying layer.

10. The semiconductor memory according to claim 9, further comprising:

power supply potential interconnect layers formed in said insulating layer between said first contact hole portion of said one cell and said second contact hole portion of said first adjacent cell, said power supply potential interconnect layers extending in said second direction, said power supply potential interconnect layers for supplying a common power supply potential to said plurality of cells including said one cell and arranged in said second direction.

11. The semiconductor memory according to claim 10, wherein each of said plurality of cells comprises:

a first resistance portion layer extending in said insulating layer in said first direction from a part of one of said power supply potential interconnect layer which overlies said first device formation region, said one power supply potential interconnect layer being formed between said second contact hole portion of each cell and said first contact hole portion of said second adjacent cell, said first resistance portion layer containing a first resistance portion; and a second resistance portion layer extending in said insulating layer in said first direction from a part of one of said power supply potential interconnect layer which overlies said second device formation region, said one power supply potential interconnect layer being formed between said first contact hole portion of each cell and said second contact hole portion of said first adjacent cell, said second resistance portion layer containing a second resistance portion.

12. The semiconductor memory according to claim 11, wherein each of said plurality of cells further comprises:

a gate electrode layer for a first driver transistor made of the same material as said ground interconnect layers and extending in said second direction so as to cover said first and second device formation regions, said gate electrode layer being provided so that a part thereof which lies in said first device formation region is formed in said insulating film immediately over said surface of said underlying layer between said second and third diffusion layer formation regions, and a part thereof which lies in said second device formation region is directly electrically connected to said fifth diffusion layer formation region;

a gate electrode layer for a second driver transistor made of the same material as said ground interconnect layers and extending in said second direction so as to cover said first and second device formation regions, said gate electrode layer being provided so that a part thereof which lies in said second device formation region is formed in said insulating film immediately over said surface of said underlying layer between said fifth and sixth diffusion layer formation regions, and a part thereof which lies in said first device formation region is directly electrically connected to said second diffusion layer formation region;

a first buried contact portion formed in a position in said insulating layer immediately over said gate electrode layer for said second driver transistor within said first device formation region for establishing an electrical connection between an end of said first high resistance portion layer extending to said position and said gate electrode layer for said second driver transistor; and a second buried contact portion formed in a position in said insulating layer immediately over said gate electrode layer for said first driver transistor within said second device formation region for establishing an electrical connection between an end of said second high resistance portion layer extending to said position and said gate electrode layer for said first driver transistor.

13. The semiconductor memory according to claim 6, wherein each of said plurality of cells comprises:

a diffusion layer of said first conductivity type different from said diffusion layer of said second conductivity type and extending from respective surfaces of said first and fourth diffusion layer formation regions forming respective bottoms of said first and second contact hole portions toward the inside of said diffusion layer of said second conductivity type.

14. The semiconductor memory according to claim 13, wherein each of said third and sixth diffusion layer formation regions comprises a pair of diffusion layers of said second conductivity type different from said diffusion layers of said first and second conductivity types and serving as source/drain regions of a transistor.

15. The semiconductor memory according to claim 12, wherein each of said plurality of cells comprises:

a diffusion layer of said first conductivity type different from said diffusion layer of said second conductivity type and extending from respective surfaces of said first and fourth diffusion layer formation regions forming respective bottoms of said first and second contact hole portions toward the inside of said diffusion layer of said second conductivity type.

16. The semiconductor memory according to claim 15, wherein said third diffusion layer formation region comprises:

a first portion of said underlying layer positioned immediately under said second word line interconnect layer;

a first diffusion layer of said second conductivity type also used as a first electrode layer of said first driver transistor; and a second diffusion layer of said second conductivity type opposed to said first diffusion layer, with said first portion of said underlying layer therebetween, said second diffusion layer being connected to one of said ground interconnect layers which is closer to said second adjacent cell, and wherein said sixth diffusion layer formation region comprises:

a second portion of said underlying layer positioned immediately under said first word line interconnect layer;

a third diffusion layer of said second conductivity type also used as a first electrode layer of said second driver transistor; and a fourth diffusion layer of said second conductivity type opposed to said third diffusion layer, with said second portion of said underlying layer therebetween, said fourth diffusion layer being connected to one of said ground interconnect layers which is closer to said first adjacent cell.

17. The semiconductor memory according to claim 5, wherein respective widths of said first and second device formation regions measured in said second direction are different at at least some corresponding device formation region locations along the first direction in each cell.

18. The semiconductor memory according to claim 17, wherein respective configurations of said first and second device formation regions in said cross section are symmetrical with respect to a line extending in said first direction.

19. The semiconductor memory according to claim 18, wherein said first and second device formation regions are configured to be symmetrical about a center point within said cell range.

\* \* \* \* \*